(12) United States Patent
Kang et al.

(10) Patent No.: US 8,885,380 B2
(45) Date of Patent: Nov. 11, 2014

(54) SEMICONDUCTOR MEMORY DEVICE

(75) Inventors: Uk-song Kang, Seongnam-si (KR);
Young-hyun Jun, Seoul (KR); Joo-sun Choi, Yongin-si (KR)

(73) Assignee: Samsung Electronics Co., Ltd.,
Samsung-ro, Yeongtong-gu, Suwon-si, Gyeonggi-do (KR)

( * ) Notice: Subject to any disclaimer, the term of this patent is extended or adjusted under 35 U.S.C. 154(b) by 489 days.

(21) Appl. No.: 13/209,026

(22) Filed: Aug. 12, 2011

(65) Prior Publication Data

US 2012/0059984 A1 Mar. 8, 2012

(30) Foreign Application Priority Data

Sep. 3, 2010 (KR) .................... 10-2010-0086580

(51) Int. Cl.
*G11C 5/02* (2006.01)
*H01L 25/18* (2006.01)
*G11C 7/10* (2006.01)

(52) U.S. Cl.
CPC ........ *H01L 25/18* (2013.01); *G11C 5/02* (2013.01); *G11C 7/10* (2013.01); *H01L 2225/06544* (2013.01); *H01L 2224/48091* (2013.01)
USPC .......................................................... 365/51

(58) Field of Classification Search
USPC .......................................................... 365/51
See application file for complete search history.

(56) References Cited

U.S. PATENT DOCUMENTS

| | | | |
|---|---|---|---|
| 7,386,659 B2 | 6/2008 | Takemae | |
| 7,554,872 B2 | 6/2009 | Ayukawa et al. | |
| 7,576,433 B2 | 8/2009 | Ishino et al. | |
| 2003/0025562 A1* | 2/2003 | Andreou et al. | 330/308 |
| 2007/0126105 A1 | 6/2007 | Yamada et al. | |
| 2008/0062773 A1* | 3/2008 | Rajan et al. | 365/189.03 |
| 2009/0024790 A1* | 1/2009 | Rajan et al. | 711/105 |
| 2009/0039492 A1 | 2/2009 | Kang et al. | |
| 2009/0091333 A1 | 4/2009 | Chung et al. | |
| 2009/0103345 A1 | 4/2009 | McLaren et al. | |
| 2009/0119464 A1* | 5/2009 | Grundy et al. | 711/154 |
| 2009/0268539 A1* | 10/2009 | Ruckerbauer et al. | 365/222 |
| 2010/0020583 A1 | 1/2010 | Kang et al. | |
| 2010/0095168 A1* | 4/2010 | Jeddeloh | 714/720 |
| 2011/0026293 A1* | 2/2011 | Riho | 365/63 |
| 2013/0223169 A1* | 8/2013 | Park | 365/194 |

FOREIGN PATENT DOCUMENTS

| | | |
|---|---|---|
| JP | 2001-344967 | 12/2001 |
| JP | 2002-259322 | 9/2002 |
| JP | 2007-012848 | 1/2007 |
| JP | 2007-157266 | 6/2007 |

(Continued)

*Primary Examiner* — Hoai V Ho
*Assistant Examiner* — Pablo Huerta
(74) *Attorney, Agent, or Firm* — Muir Patent Consulting, PLLC

(57) ABSTRACT

A semiconductor package is disclosed. The semiconductor package includes a package interface, a stack of semiconductor chips, a plurality of stacks of through substrate vias, and an interface circuit. The package interface includes at least a first pair of terminals. Each stack of through substrate vias includes plural through substrate vias of respective ones of the semiconductor chips, each through substrate via electrically connected to a through substrate via of an immediately adjacent semiconductor chip. The interface circuit includes an input connected to the first pair of terminals to receive a differential signal providing first information, and includes an output to provide an output signal including the first information in a single-ended signal format to at least one of the plurality of stacks of through substrate vias.

60 Claims, 36 Drawing Sheets

(56) References Cited

FOREIGN PATENT DOCUMENTS

| JP | 2008-299997 | 12/2008 |
| KR | 10-2001-0107538 A | 12/2001 |
| KR | 10-2009-0014631 A | 2/2009 |
| KR | 10-2009-0034785 A | 4/2009 |
| KR | 10-2009-0088455 A | 8/2009 |
| KR | 10-2010-0011613 A | 2/2010 |

* cited by examiner

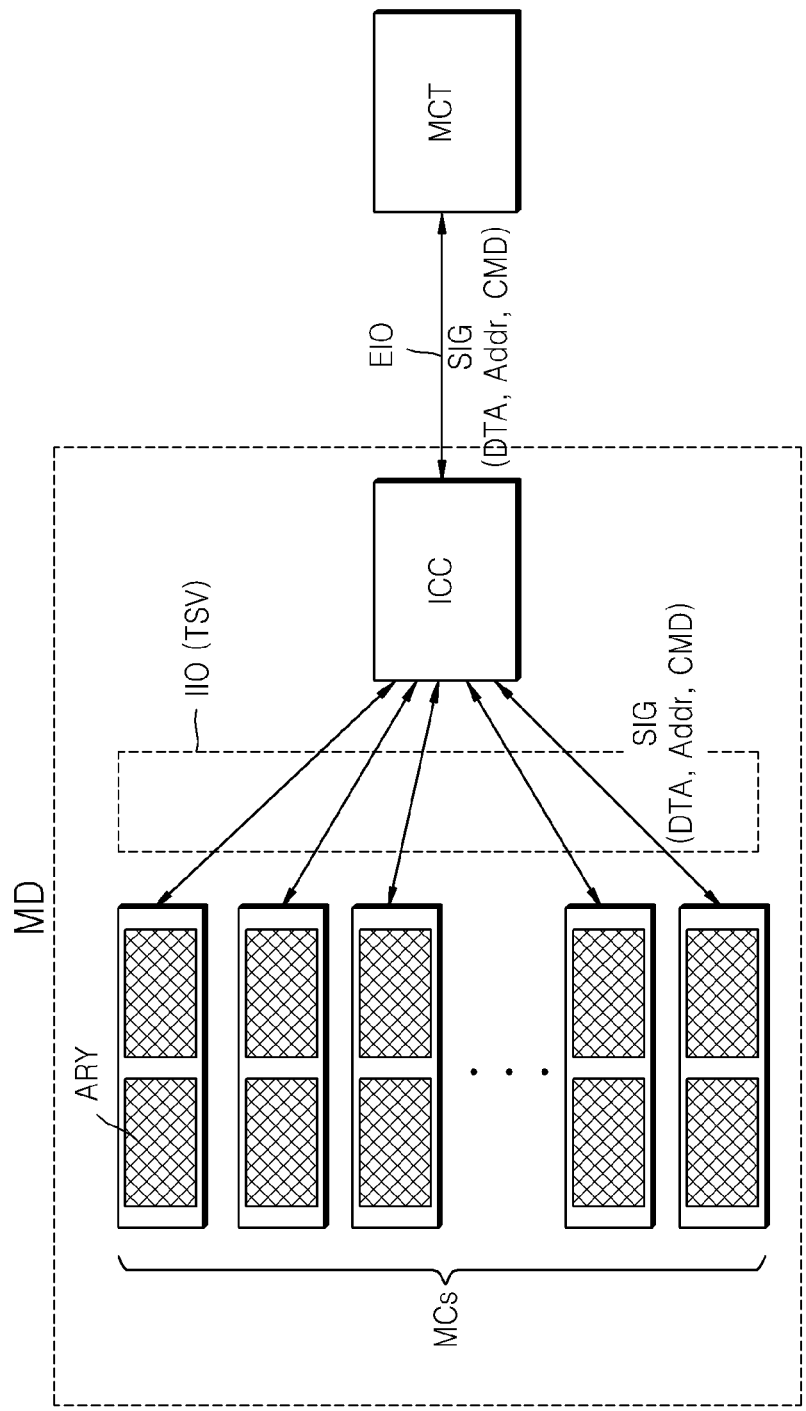

FIG. 3
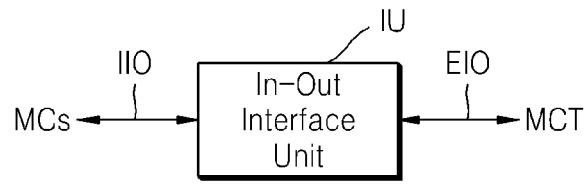
FIG. 4
| Type of EIO | Type of IIO | Burst Length | Data rate/TSV | #DQ TSVs |
|---|---|---|---|---|
| Differential IO (x32) | Single-Ended IO | BL1 | 200 Mbps | 6400 |
| | | BL2 | 400 Mbps | 3200 |
| | | BL4 | 800 Mbps | 1600 |
| | Multi-Level IO (4 level) | BL1 | 400 Mbps | 3200 |
| | | BL2 | 800 Mbps | 1600 |
| | | BL4 | 1600 Mbps | 800 |
| | Differential IO | BL1 | 200 Mbps | 12800 |
| | | BL2 | 400 Mbps | 6400 |
| | | BL4 | 800 Mbps | 3200 |
FIG. 5
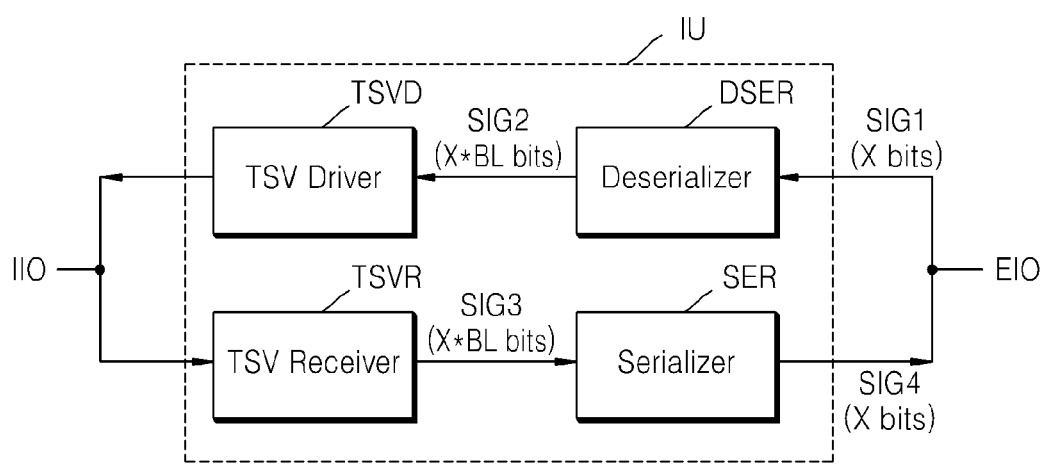

FIG. 10
(a)
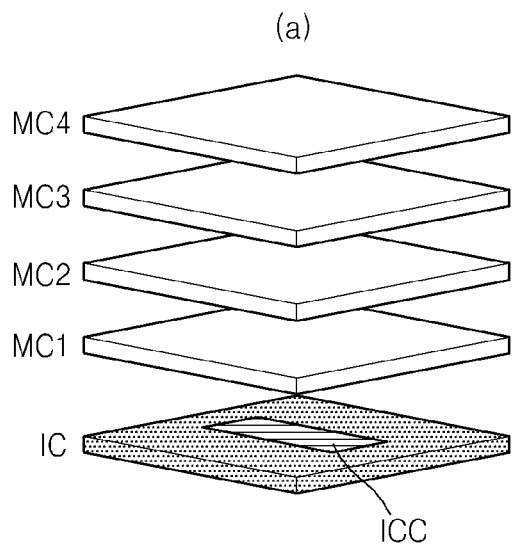
(c)
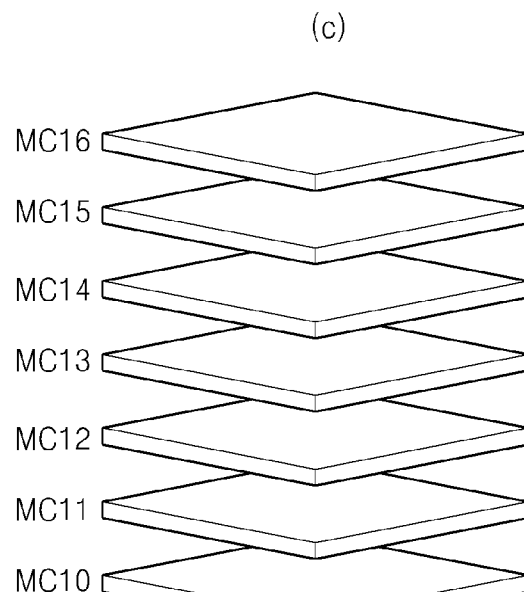
(b)
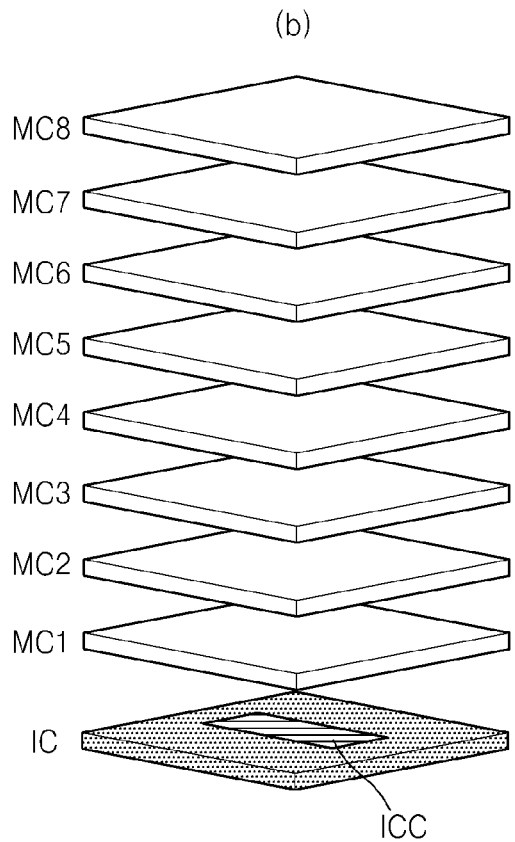
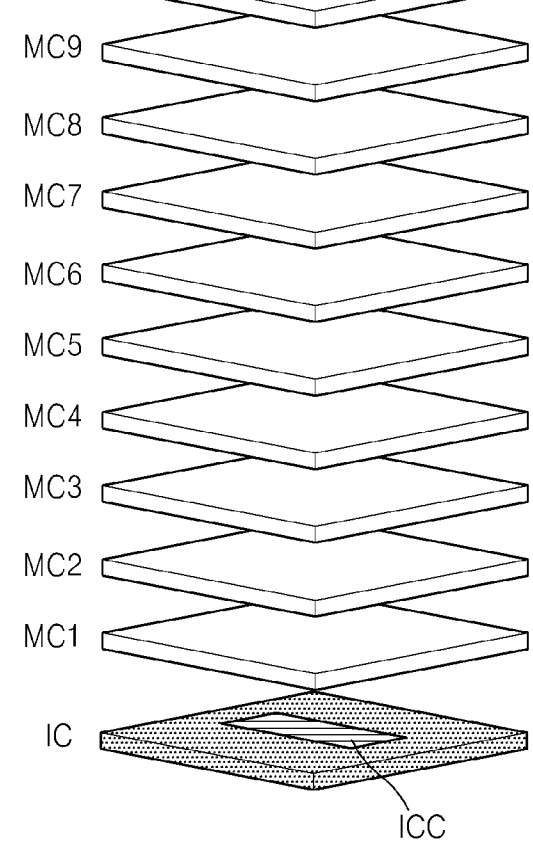

FIG. 17
(a)
Address Scrambler
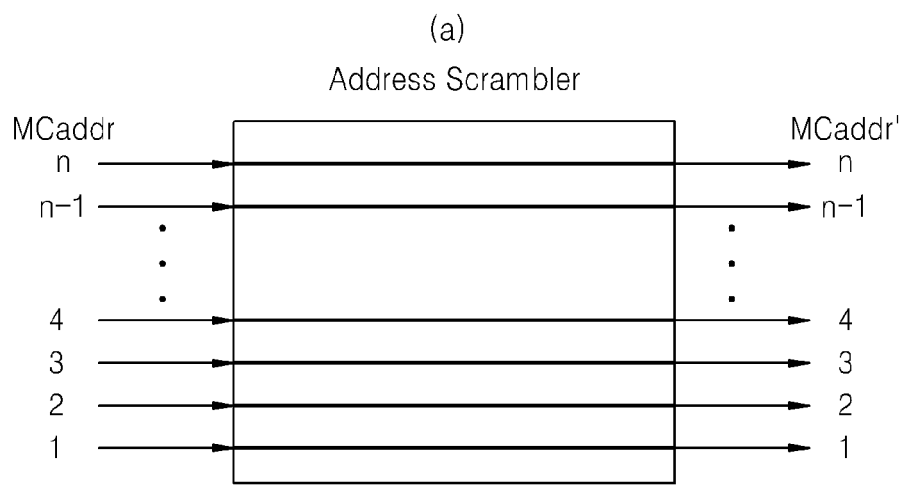
(b)
Address Scrambler
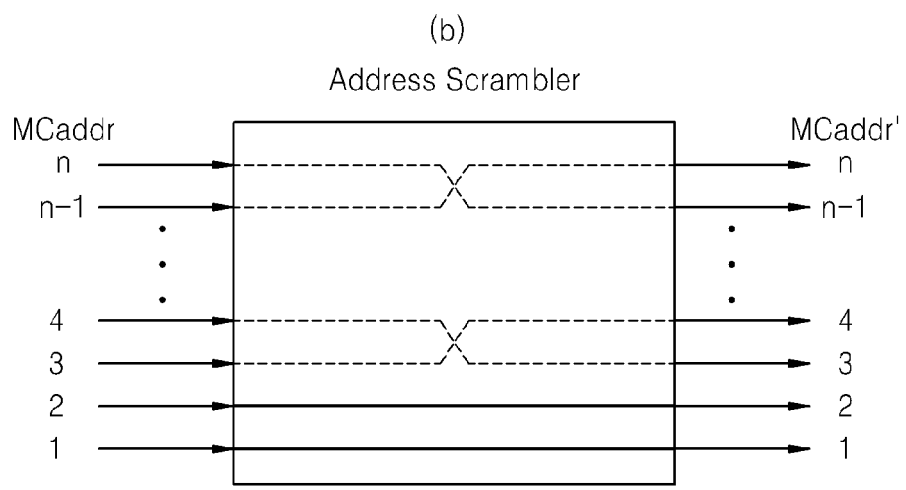

MCaddr4 = Addr[m : m−1] = 11
MCaddr3 = Addr[m : m−1] = 10
MCaddr2 = Addr[m : m−1] = 01
MCaddr1 = Addr[m : m−1] = 00

MCaddr4 = Addr[m : m−2] = 111
MCaddr4 = Addr[m : m−2] = 110
MCaddr4 = Addr[m : m−2] = 101
MCaddr4 = Addr[m : m−2] = 100
MCaddr4 = Addr[m : m−2] = 011
MCaddr4 = Addr[m : m−2] = 010
MCaddr4 = Addr[m : m−2] = 001
MCaddr4 = Addr[m : m−2] = 000

FIG. 25
(a) 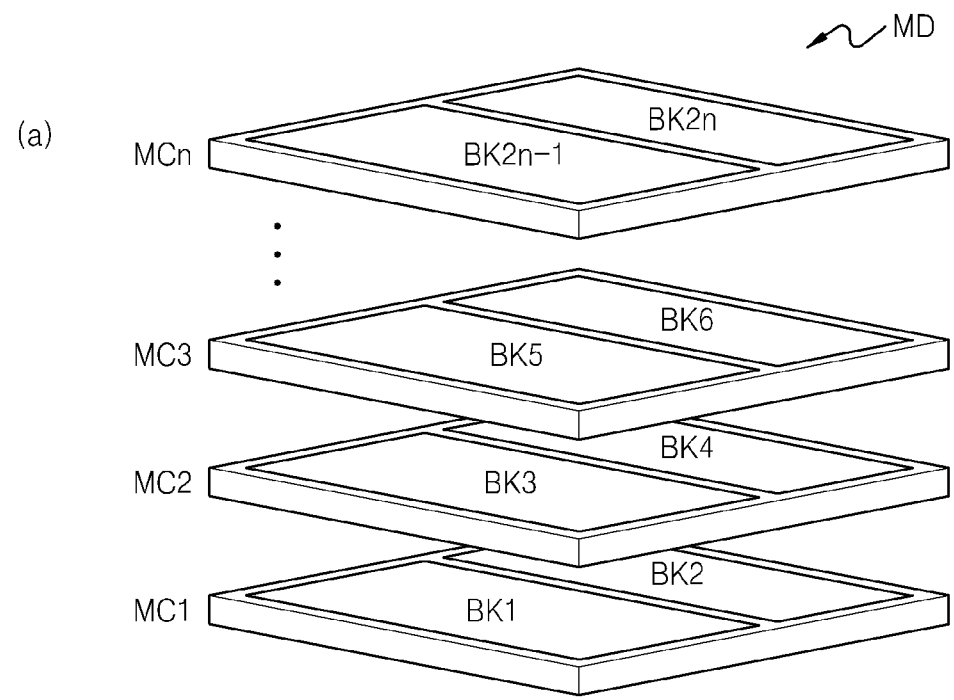
(b) 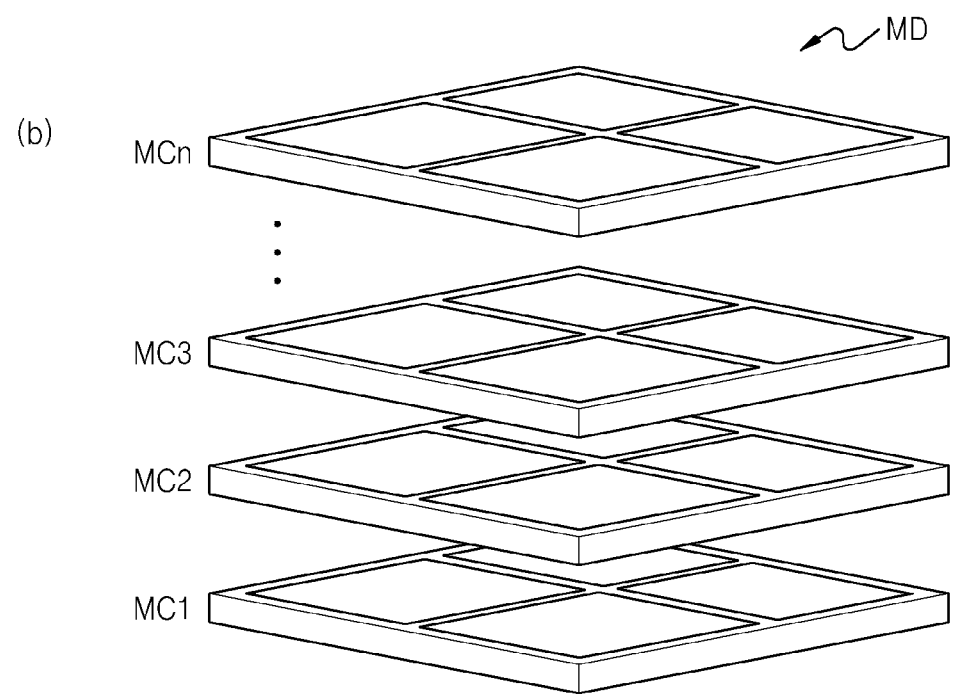

FIG. 27
(a)
Address Scrambler
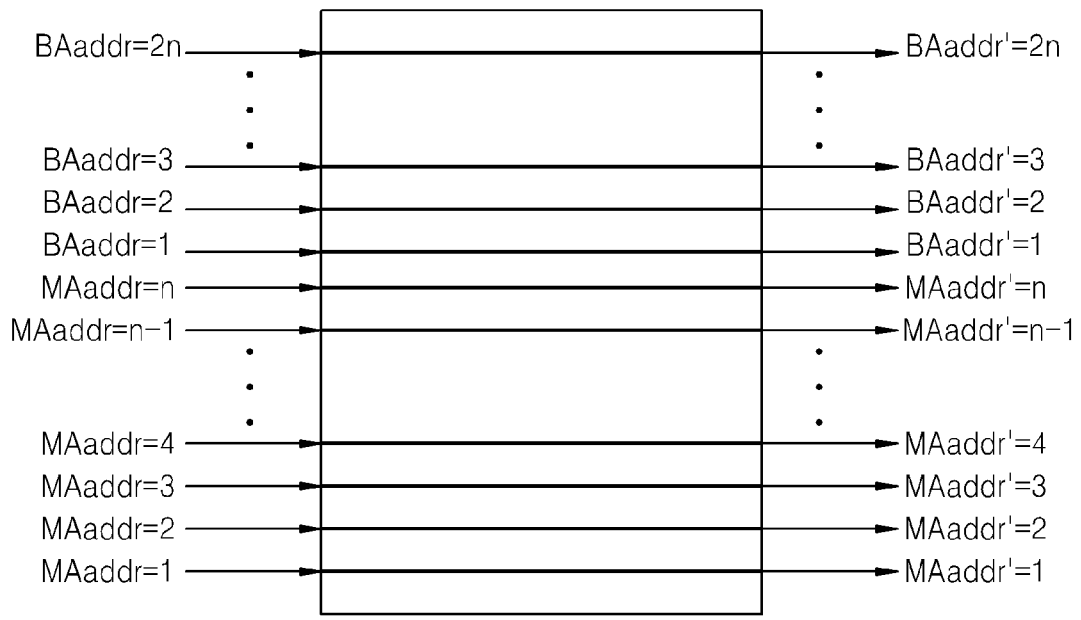
(b)
Address Scrambler
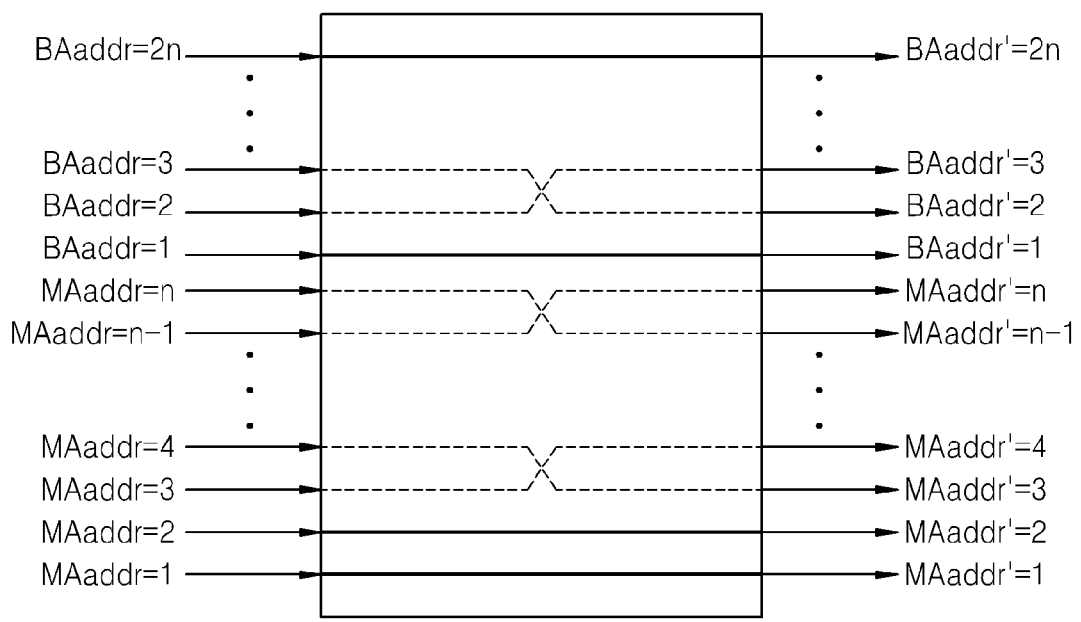

FIG. 28
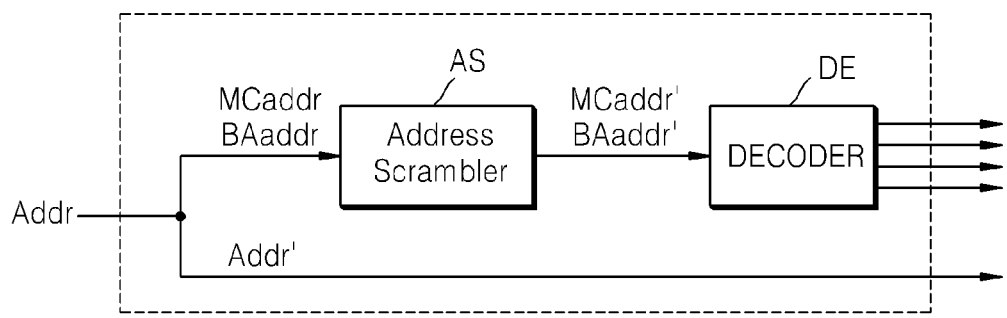
FIG. 29
(a)
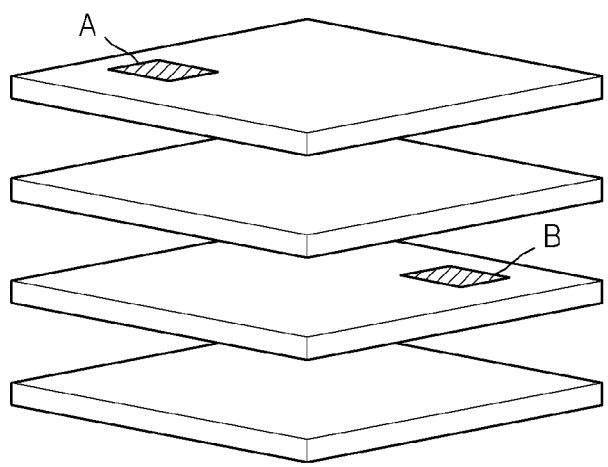
(b)
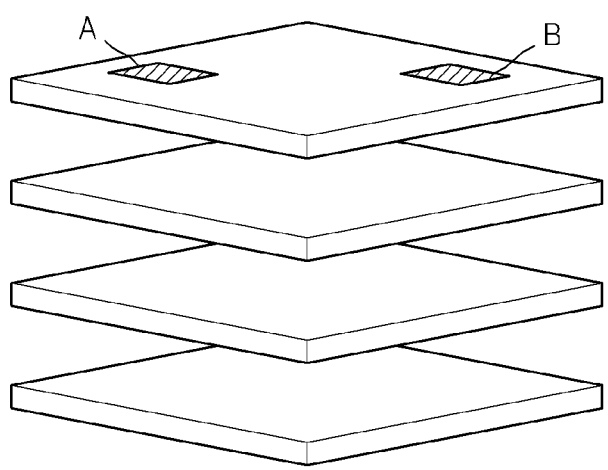

FIG. 41
(a) 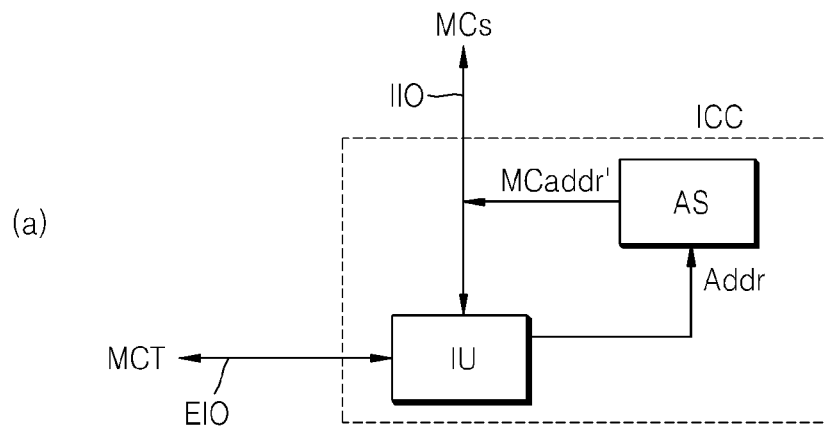
(b) 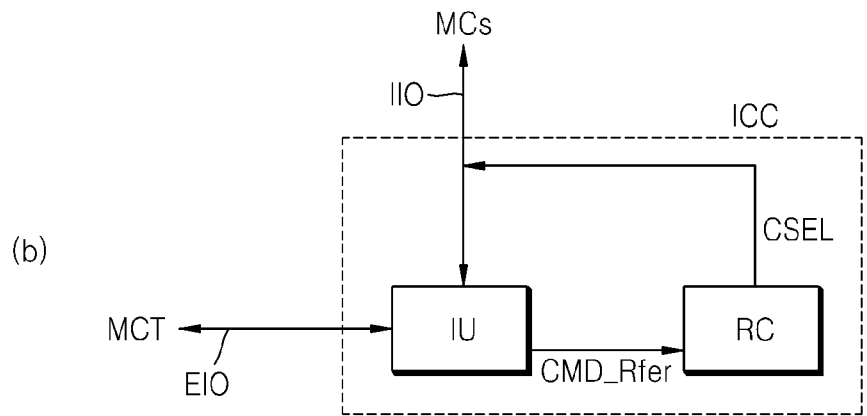
(c) 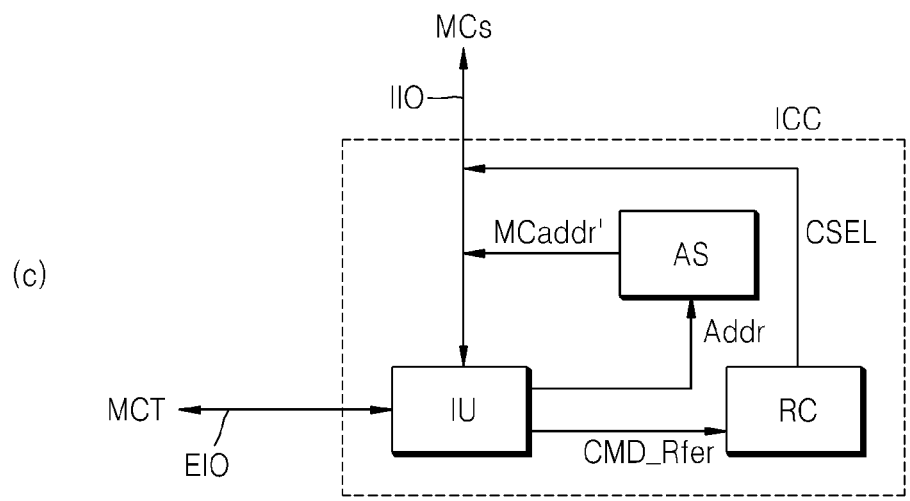

SEMICONDUCTOR MEMORY DEVICE

CROSS-REFERENCE TO RELATED APPLICATIONS

This application claims the benefit of Korean Patent Application No. 10-2010-0086580, filed on Sep. 3, 2010 in the Korean Intellectual Property Office, the disclosure of which is incorporated herein in its entirety by reference.

BACKGROUND

One or more aspects of the disclosed embodiments relate to semiconductor memory devices, and more particularly, to a semiconductor memory device for efficiently controlling a stacked structure of semiconductor memory chips.

As high integration degree and high performance of semiconductor memory devices have been continuously required, importance of a stacked structure of semiconductor memory chips has increased. In addition, due to the compact stacked structure of such semiconductor memory devices, unwanted interference and heat associated with accessing the device occurs more frequently. Accordingly, there is a need to efficiently control a stacked structure of semiconductor memory chips, to maintain the highly integrated configuration of the semiconductor memory chips, and to reduce interference and excessive heat associated with stacked semiconductor memory chips.

SUMMARY

One or more aspects of the disclosed embodiments provide semiconductor memory devices, including semiconductor packages, for efficiently controlling a stacked structure of semiconductor memory chips.

In one embodiment, a semiconductor package includes a package interface, a stack of semiconductor chips, a plurality of stacks of through substrate vias, and an interface circuit. The package interface includes at least a first pair of terminals. Each stack of through substrate vias includes plural through substrate vias of respective ones of the semiconductor chips, each through substrate via electrically connected to a through substrate via of an immediately adjacent semiconductor chip. The interface circuit includes an input connected to the first pair of terminals to receive a differential signal providing first information, and includes an output to provide an output signal including the first information in a single-ended signal format to at least one of the plurality of stacks of through substrate vias.

In another embodiment, a semiconductor package includes a package interface, a stack of semiconductor chips, a plurality of stacks of through substrate vias, and an interface circuit. The package interface includes at least a first pair of terminals. Each stack of through substrate vias includes plural through substrate vias of respective ones of the semiconductor chips, each through substrate via electrically connected to a through substrate via of an immediately adjacent semiconductor chip. The interface circuit includes an input connected to the first pair of terminals to receive a differential input signal providing first information, and includes an output to provide a differential output signal including the first information in a differential signal format to at least one of the plurality of stacks of through substrate vias.

In another embodiment, a semiconductor package includes a package interface, a stack of semiconductor chips, a plurality of stacks of through substrate vias, and an interface circuit. The package interface includes at least a first pair of terminals. Each stack of through substrate vias includes plural through substrate vias of respective ones of the semiconductor chips, each through substrate via electrically connected to a through substrate via of an immediately adjacent semiconductor chip. The interface circuit includes an input connected to the first pair of terminals to receive a differential input signal providing first information, and includes an output to provide an output signal including the first information to at least one of the plurality of stacks of through substrate vias. The interface circuit is configured to interpret the differential input signal as a multi-level signal, and to provide the output signal based on the interpreted multi-level signal.

In another embodiment, a semiconductor package includes package terminals connectable to an address bus, a stack of memory chips, an interface circuit, and a plurality of stacks of through substrate vias. The interface circuit includes an address buffer connected to the package terminals to receive an external address, an address translation circuit connected to receive the external address from the address buffer, and having an output of an internal address, and a monitoring circuit configured to monitor an amount of access operations to at least one memory location of the stack of memory chips and provide a corresponding monitoring result. Each stack of through substrate vias include plural through substrate vias of respective ones of the memory chips of the stack, each through substrate via electrically connected to a through substrate via of a immediately adjacent memory chip, each stack of through substrate vias connected to receive the internal address at the output of the address translation circuit. The address translation circuit is configured to translate the external address to an internal address in response to at least the monitoring result of the monitoring circuit.

In another embodiment, a semiconductor package includes package terminals, a stack, of memory chips, an interface circuit, and a plurality of stacks of through substrate vias. The interface circuit includes an address buffer connected to the package terminals to receive an external address, and an address translation circuit connected to receive the external address from the address buffer, and having an output that outputs an internal address. Each stack of through substrate vias include plural through substrate vias of respective ones of the memory chips each electrically connected to a through substrate via of an immediately adjacent memory chip, each stack of the plurality of stacks of through substrate vias connected to receive an internal address at the output of the address translation circuit. The interface circuit further includes a refresh controller in logical communication with the package terminals and configured to receive an external refresh control signal, the refresh controller operable to output a series of internal refresh control signals, each of the series of internal refresh control signals operable to initiate a memory refresh of different parts of the stack of memory chips.

In another embodiment, a semiconductor package includes a package interface, a stack of memory chips, a plurality of stacks of through substrate vias, and an interface circuit. The package interface includes package terminals including at least a first pair of terminals. Each stack of through substrate vias includes plural through substrate vias of respective ones of the memory chips, each through substrate via electrically connected to a through substrate via of an immediately adjacent memory chip. The interface circuit includes: an input connected to the first pair of terminals to receive a differential signal providing first information, and including an output to provide an output signal including the first information in a single-ended signal format to at least one of the plurality of stacks of through substrate vias; an address buffer connected to a plurality of the package terminals to receive an external address; an address translation circuit connected to receive the external address from the address buffer, and having an output of an internal address; a monitoring circuit configured to monitor an amount of access operations to at least one memory location of the stack of memory chips and provide a corresponding monitoring result; and a refresh controller in logical communication with a plurality of the package terminals and configured to receive an external refresh control signal, the refresh controller operable to output a series of internal refresh control signals, each of the series of internal refresh control signals operable to initiate a memory refresh of different parts of the stack of memory chips. The address translation circuit is configured to translate the external address to an internal address in response to at least the monitoring result of the monitoring circuit.

In another embodiment, a method of refreshing a stack of memory chips in a semiconductor package is disclosed. The method includes receiving a single external refresh command, and in response to the single external refresh command, refreshing first and second chips of the stack of memory chips in sequential order.

BRIEF DESCRIPTION OF THE DRAWINGS

Exemplary embodiments discussed herein will be more clearly understood from the following detailed description taken in conjunction with the accompanying drawings in which:

FIG. 1 is a block diagram of a semiconductor memory device according to an exemplary embodiment;

FIG. 3 is a block diagram of an input/output (I/O) interface unit included in the interface control circuit of FIG. 1 according to an exemplary embodiment;

FIG. 4 is a table showing examples of the number of through electrodes included in the semiconductor memory device according to a combination of a first I/O type and a second I/O type employed by the internal I/O unit and the external I/O unit of FIG. 3, according to an exemplary embodiment;

FIG. 5 is a detailed block diagram of the I/O interface unit of FIG. 3 according to an exemplary embodiment;

FIGS. 10 A to 10C illustrate examples of a stacked structure of semiconductor memory chips as shown in FIG. 9, according to exemplary embodiments;

FIGS. 17A and 17B illustrate scrambling methods that may be employed by the address scrambler of FIG. 15, according to exemplary embodiments;

FIGS. 25A and 25B illustrate examples of the semiconductor memory device of FIG. 1, in which each of semiconductor memory chips includes a plurality of banks, according to exemplary embodiments;

FIGS. 27A and 27B illustrate scrambling methods that may be employed by the address scrambler of FIG. 26, according to another exemplary embodiment;

FIG. 28 is a block diagram of an interface control circuit that includes the address descrambler of FIG. 26, according to another exemplary embodiment;

FIGS. 29A and 29B illustrate operations of the address scrambler of FIG. 15 according to exemplary embodiments;

FIGS. 41A to 41C are block diagrams illustrating cases where the interface control circuit of FIG. 1 includes at least two devices from among an I/O interface unit, an address scrambler, and a refresh controller, according to exemplary embodiments;

FIGS. 45A through 46B illustrate examples of the semiconductor memory module of FIG. 44 according to exemplary embodiments.

DETAILED DESCRIPTION OF THE EMBODIMENTS

Figure 2A:
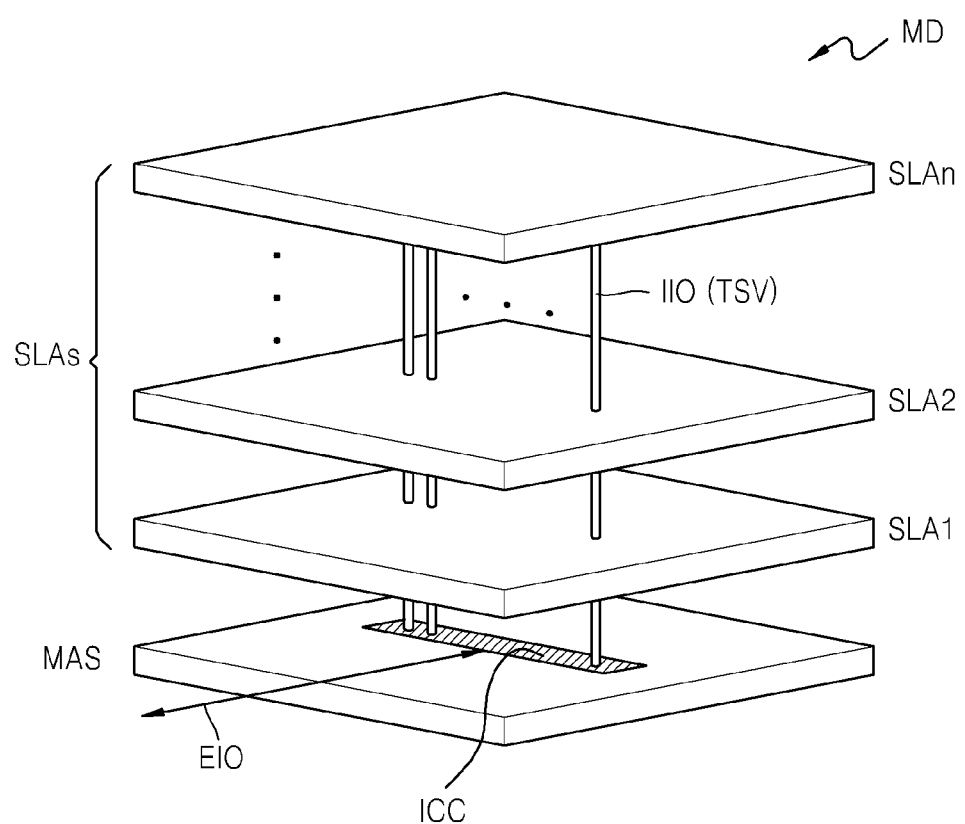
FIGS. 2a-2c illustrate a structure of an interface control circuit included in the semiconductor memory device of FIG. 1 according to exemplary embodiments.

Hereinafter, exemplary embodiments will be described in detail with reference to the accompanying drawings. Like reference numerals denote like elements throughout the drawings. The disclosed embodiments may, however, be embodied in many different forms and should not be construed as being limited to the embodiments set forth herein.

It will be understood that when an element or layer is referred to as being "on," "connected to," "coupled to," or "adjacent to" another element or layer, it can be directly on, connected, coupled, or adjacent to the other element or layer or intervening elements or layers may be present. In contrast, when an element is referred to as being "directly on," "directly connected to," "directly coupled to," "directly adjacent to," another element or layer, or the like, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an edge or corner region illustrated as having sharp edges may have somewhat rounded or curved features. Likewise, elements illustrated as circular or spherical may be oval in shape or may have certain straight or flattened portions. Thus, the regions illustrated in the figures are schematic in nature and their shapes are not intended to illustrate the actual shape of a region or element of a device and are not intended to limit the scope of the disclosed embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a semiconductor memory device MD according to an exemplary embodiment. Referring to FIG. 1, the semiconductor memory device MD includes a stacked structure of semiconductor memory chips MCs. Each of the semiconductor memory chips MCs may be a volatile or non-volatile memory chip. As such, the semiconductor memory device MD may be a semiconductor package including a plurality of stacked chips. The semiconductor package may also include a package substrate (not shown) on which the stacked chips are disposed. In addition, the semiconductor memory device MD may include an encapsulant (not shown) that covers the stacked chips. The encapsulant may be formed, for example, of a resin or other insulating material, to protect the components of the package substrate and memory chips from the external environment.

In one embodiment, each of the semiconductor memory chips MCs includes a storage region ARY for storing data DTA. Although FIG. 1 illustrates that the storage region ARY of each of the semiconductor memory chips MCs is divided into two parts, the present disclosure is not limited thereto. Each of the semiconductor memory chips MCs may include a non-divided storage region or a storage region that is divided into more than two parts.

In FIG. 1, an interface control circuit ICC controls an exchange of a signal SIG between an external circuit, e.g., a memory controller MCT, and the semiconductor memory chips MCs. In detail, the interface control circuit ICC controls the signal SIG to be transmitted to or be output from the semiconductor memory chips MCs via an internal input/output (I/O) unit IIO, and controls the signal SIG to be transmitted to or be output from the outside via an external I/O unit EIO.

FIG. 1 illustrates the internal I/O unit IIO and the external I/O unit EIO by using arrows, for convenience of explanation, but the internal I/O unit IIO may be a conductive material such as through electrodes and the external I/O unit EIO may include circuitry such as a data bus. In particular, the through electrodes may be through substrate vias (e.g., conductive material passing through one or more chips or portions of chips, such as chip substrates). In an embodiment where chips are silicon chips, the through substrate vias may be through silicon vias. As used herein, the term "through substrate via" may refer to single via passing through a single chip, or may refer to a group of vias connected to each other and passing through a stack of chips (i.e., a stack of vertically aligned through substrate vias). Similarly, the term "through electrode" may refer to an electrode passing through a single chip, or to a stack of vertically aligned electrodes passing through a stack of chips.

In some instances, respective through substrate vias pass entirely through each respective chip in a stack of chips. However, in other instances, one or more through substrate vias passing through one or more respective chips only pass partly through the chip, and then connect to circuitry within the chip. The circuitry is electrically connected to the through substrate via, and may electrically connect to a pad or other electrically conductive element that connects to a through substrate via of a next, immediately adjacent chip. Also, certain through substrate vias may pass through certain chips without electrically connecting to circuitry in the chip.

In one embodiment, the stacked chips align vertically, and each chip has the same planar dimensions. As such, outer edges of the chips may align as well. In addition, the chips may have the same thickness, and may be identical chips. However, the stack of chips need not include all chips having the same dimensions, and some chips in the stack of chips can have smaller dimensions than others, or can be shifted in a lateral direction compared to others so that the outer edges of the chips do not align.

The external I/O unit EIO may be a system data bus connected to an external memory controller MCT. The signal SIG transmitted via the internal I/O unit IIO or the external I/O unit EIO may be an address signal including an address Addr, data signal including data DTA, and/or a command signal including a command CMD for operating the semiconductor memory device MD.

In one embodiment, the interface control circuit ICC that performs as an interface among the stacked structure of the semiconductor memory chips MCs, the internal I/O unit IIO, and the external I/O unit EIO is included in the semiconductor memory device MD and may be in various forms, as will be described below.

Figure 2B:
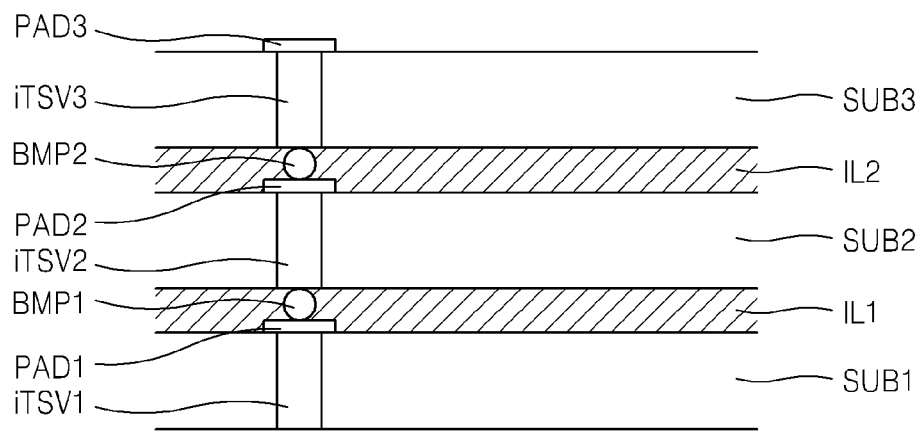
Figure 2C:
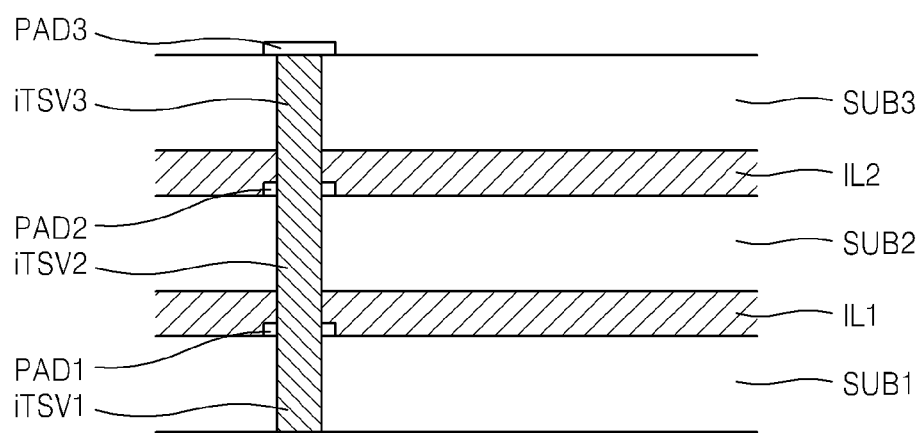

FIGS. 2a-2c illustrate structures of the interface control circuit ICC included in the semiconductor memory device MD of FIG. 1 according to exemplary embodiments. Referring to FIG. 2a, in one embodiment of the semiconductor memory device MD, the interface control circuit ICC is included in one of the semiconductor memory chips. The semiconductor memory chip that includes the interface control circuit ICC from among the semiconductor memory chips, may be referred to as a master memory chip MAS. That is, the semiconductor memory chips of the semiconductor memory device MD of FIG. 2a consist of the master memory chip MAS that includes the interface control circuit ICC, which includes one or more buffers and a storage region (not shown), and a plurality of slave memory chips SLAs that do not include the interface control circuit ICC and that include a storage region (not shown). However, the interface control circuit ICC may be part of a chip, referred to as an interface control chip, that either includes storage regions or does not include any storage regions, and the interface control chip may also include additional logic portions or may not include logic portions. The interface control chip may decouple certain external signals from the internal circuitry of the stack of semiconductor memory chips by passing them through buffers, logic circuitry, or other processing circuitry, but may also directly pass certain external signals through to the internal chips (e.g., certain power signals) without decoupling those signals.

As described above, the internal I/O unit IIO may be through electrodes (e.g., through-substrate vias, or more specifically through-silicon vias), labeled "TSV," for electrically connecting the interface control circuit ICC to the slave memory chips SLAs. The through electrodes TSV of the internal I/O unit IIO may be disposed for receiving the address Addr, the data DTA, or the command CMD, respectively. In one embodiment, since the interface control circuit ICC is included in the master memory chip MAS, the internal I/O unit IIO that connects the interface control circuit ICC to the master memory chip MAS may be formed of an internal electric wire (not shown). Referring to FIG. 2a, as will also be shown in the other drawings, the semiconductor memory chips are illustrated as being disposed apart from each other for convenience of explanation so as to illustrate the through electrodes TSV for electrically connecting the semiconductor memory chips to each other. In practice, however, in the semiconductor memory device MD, the semiconductor memory chips may be disposed in such a manner that adjacent semiconductor memory chips connect to each other through an intermediate layer.

For example, referring to FIGS. 2b and 2c, each semiconductor memory chip in the stack may include a substrate (SUB), and each semiconductor memory chip in the stack may be separated from the next semiconductor chip in the stack by an intermediate layer (IL). The intermediate layer may include, for example, an insulation layer (IL) to electrically separate the memory chip from the next adjacent memory chip in the stack, an adhesive material, or another material.

The semiconductor memory device MD may include the through electrodes TSV each arranged as a stack of through substrate vias, each through substrate via of the stack passing through a respective chip. For example, as shown in FIGS. 2b and 2c, individual through substrate vias iTSV each pass through a respective chip in the stack (i.e., iTSV1 passes through SUB1, iTSV2 passes through SUB2, etc.). The individual through substrate vias may be vertically aligned to form a stack of through substrate vias electrically connected to each other. For example, in the embodiment depicted in FIG. 2b, each individual through substrate via (iTSV1, iTSV2, iTSV3) connects to a respective conductive pad (PAD1, PAD2, PAD3), which connects to a conductive ball or bump (BMP) connected to an individual through substrate via of the next adjacent semiconductor chip. Each pad PAD may be disposed at an active surface of the chip, and may connect to circuitry in the chip. In the embodiment depicted in FIG. 2c, each chip includes a through substrate via that electrically connects to a through substrate via of a next adjacent chip to form a stack of through substrate vias that comprise a single continuous through substrate via passing through the stack of chips. As such, the single through substrate via passes through any intermediate layers (e.g., insulating layers, adhesive layers, etc.) that may be disposed between the substrates of adjacent chips of the stack. In the embodiment shown in FIG. 2c, each chip may include a pad that surrounds and electrically connects to the single through substrate via and that is disposed at an active surface of the chip. The pad may connect to circuitry on the chip. The embodiments are not limited to those depicted in FIGS. 2b and 2c, however, and other embodiments that include stacked chips each including respective through vias may be employed.

Although not shown in FIGS. 2a-2c, when the semiconductor memory chips are disposed apart from each other, they may be supported by an interposer (not shown).

In FIGS. 2a-2c, if the internal I/O unit IIO includes the through electrodes TSV in the semiconductor memory device MD having the highly integrated semiconductor memory chips, an excessive number of through electrodes TSVs may be needed for high-bandwidth transmission. In this case, chip size may be increased more than desired.

For high-bandwidth transmission, the semiconductor memory device MD according to one embodiment may provide an interface optimized for a stacked structure of the semiconductor memory chips. To this end, in the semiconductor memory device MD, an I/O type employed by the internal I/O unit IIO an I/O type employed by the external I/O unit EIO may be combined in various ways, as will be described below in detail.

FIG. 3 is a block diagram of an I/O interface unit IU included in the interface control circuit ICC of FIG. 1 according to an exemplary embodiment. Referring to FIG. 3, the interface control circuit ICC includes the I/O interface unit IU that provides an interface between an internal I/O unit IIO for receiving/transmitting a signal according to a first I/O type and an external I/O unit EIO for receiving/transmitting a signal according to a second I/O type. The I/O interface unit IU may perform interfacing, based on a combination of a first I/O type of IIO and a second I/O type of EIO introduced in the table of FIG. 4.

FIG. 4 is a table showing examples of the number of through electrodes included in the semiconductor memory device MD according to a combination of a first I/O type and a second I/O type employed by the internal I/O unit IIO and the external I/O unit EIO.

Referring to FIGS. 3 and 4, in the first I/O type, the number of through electrodes that are to be included in the internal I/O unit IIO is determined according to a bandwidth required by the semiconductor memory device MD. The external I/O unit EIO according to an embodiment of the inventive concept may receive/transmit a signal according to one of various I/O types including a differential I/O type. In one embodiment, it is assumed that the external I/O unit EIO is operated according to the differential I/O type, and particularly, an x32 differential I/O type, so that the semiconductor memory device MD may achieve a high data transmission rate. If the external I/O unit EIO of the semiconductor memory device MD transmits and receives a signal according to a single-ended I/O type, then the number of through electrodes required is determined according to one of the following conditions. If the second I/O type is the single-ended I/O type, in one embodiment, the number of pins (not shown) should be two times higher than when the second I/O type is the differential I/O type so that the semiconductor memory device MD may receive a signal via the external I/O unit EIO.

The first I/O type may be one of various I/O types introduced in the table of FIG. 4. For example, the first I/O type may be the single-ended I/O type, in which a signal is transmitted via the internal I/O unit IIO. In this case, it may be assumed that the semiconductor memory device MD requires a bandwidth of 160 GB/sec for a 200 MHz core cycle time. This assumption is also applied to the other embodiments.

If the first I/O type is the single-ended I/O type and the second I/O type is the differential I/O type, the semiconductor memory device MD requires 6400 through electrodes that operate at a data (transmission) rate of 200 Mbps (Case 1). That is, if the first I/O type is the single-ended I/O type, a product of the number of through electrodes required and a data rate of each of the through electrodes should satisfy a bandwidth required by the semiconductor memory device MD.

In this case, the number of through electrodes required varies according to the data rates of the through electrodes at even the same bandwidth. For example, when the data rates of the through electrodes of the semiconductor memory device MD double, e.g., 400 Mbps, 3200 through electrodes are required for the semiconductor memory device MD to have a bandwidth of 160 GB/sec (Case 2). The data rate of each of the through electrodes may be adjusted by changing a burst length of data (signal) transmitted/received via each of the through electrodes. In other words, a comparison of Case 1 and Case 2 reveals that the data rate of the through electrode also doubles when the burst length of data doubles.

Thus, if the burst length of data is set to '4', the semiconductor memory device MD requires 1600 through electrodes that operate at a data rate of 800 Mbps under the same conditions (Case 3).

Accordingly, if the first I/O type is the single-ended I/O type and the second I/O type is the differential I/O type, the I/O interface unit IU of FIG. 3 may have a structure as illustrated in FIG. 5.

Referring to FIG. 5, the I/O interface unit IU may include a deserializer DSER that receives an external signal SIG1, which consists of X bits (X denotes an integer equal to or greater than '2'), via an external I/O unit EIO according to the differential I/O type and converts the external signal SIG1 into a parallel signal SIG2, and a driver TSVD that delivers the parallel signal SIG2 received via the deserializer DSER to through electrodes. As described above, if the signal SIG1 received from the external I/O unit EIO according to the differential I/O type is a 32-bits signal, that is, if the X is '32', then the parallel signal SIG2 is an XxBL-bits signal.

The I/O interface unit IU may further include a receiver TSVR that receives an internal signal SIG3 via the internal I/O unit IIO according to the single-ended I/O type, and a serializer SER that converts the internal signal SIG3 received from the receiver TSVR into a serial signal SIG4 and transmits the serial signal SIG4 via the external I/O unit EIO.

Referring back to FIG. 4, a case where the first I/O type is a multi-level I/O type will be described. Multi-level signals are signals that represent three or more bit states and are interpreted as such (e.g., one type of multi-level signal represents four states, 00, 01, 10, and 11, represented by four different voltage levels), while single-level signals only represent 2 bit states (i.e., 1 or 0). When a signal is transmitted and received via the internal I/O unit IIO according to the multi-level I/O type, and particularly, a four-level method, the semiconductor memory device MD requires 3200 through electrodes that operate at a data rate of 400 Mbps (Case 4). That is, if the first I/O type is the multi-level I/O type, a product of the number of through electrodes required and a data rate of each of the through electrodes should satisfy a bandwidth required by the semiconductor memory device MD.

However, if in the multi-level I/O type, the burst length of data is set to '2', the semiconductor memory device MD requires 1600 through electrodes that operate at a data rate of 800 Mbps under the same conditions (Case 5). If the burst length of data is set to '4', the semiconductor memory device MD also requires 1600 through electrodes that operate at a data rate of 800 Mbps under the same conditions (Case 6).

Lastly, when the internal I/O unit IIO is driven according to the differential I/O type, the semiconductor memory device MD requires 12800 through electrodes that operate at a data rate of 200 Mbps (Case 7). That is, if the first I/O type is the differential I/O type, a product of twice as many as the number of through electrodes required and the data rate of each of the through electrodes should satisfy a bandwidth required by the semiconductor memory device MD.

However, if the burst length of data is set to '2' when the internal I/O unit IIO is driven according to the differential I/O type, the semiconductor memory device MD requires 6400 through electrodes that operate at a data rate of 400 Mbps (Case 8). Similarly, if the burst length of data is set to '4', the semiconductor memory device MD requires 3200 through electrodes that operate at a data rate of 800 Mbps under the same conditions (Case 9).

Various combinations of I/O types employed by an internal I/O unit and an external I/O unit of a semiconductor memory device according to various embodiments, respectively, have been described above. As described above, the semiconductor memory device may determine I/O types to be employed by the internal I/O unit and the external I/O unit, respectively, based on a number of through electrodes required. Also, the semiconductor memory device may determine I/O types to be employed by the internal I/O unit and the external I/O unit, based on a data rate of each of the through electrodes. However, the inventive concept is not limited to the above description. In addition, in one embodiment, an interface control circuit may be configured such that only certain signal types, such as data signals, are converted between different I/O types (e.g., from differential to single-ended), while other signal types, such as address or control signals or power connections, are not converted between different I/O types. That is, in one embodiment, only data signals are converted between different I/O types by an interface control circuit ICC.

An I/O interface unit IU of the semiconductor memory device may perform interfacing for various I/O protocols so as to provide an interface optimized for a stacked structure of semiconductor memory chips that operate at a high bandwidth.

Figure 6:
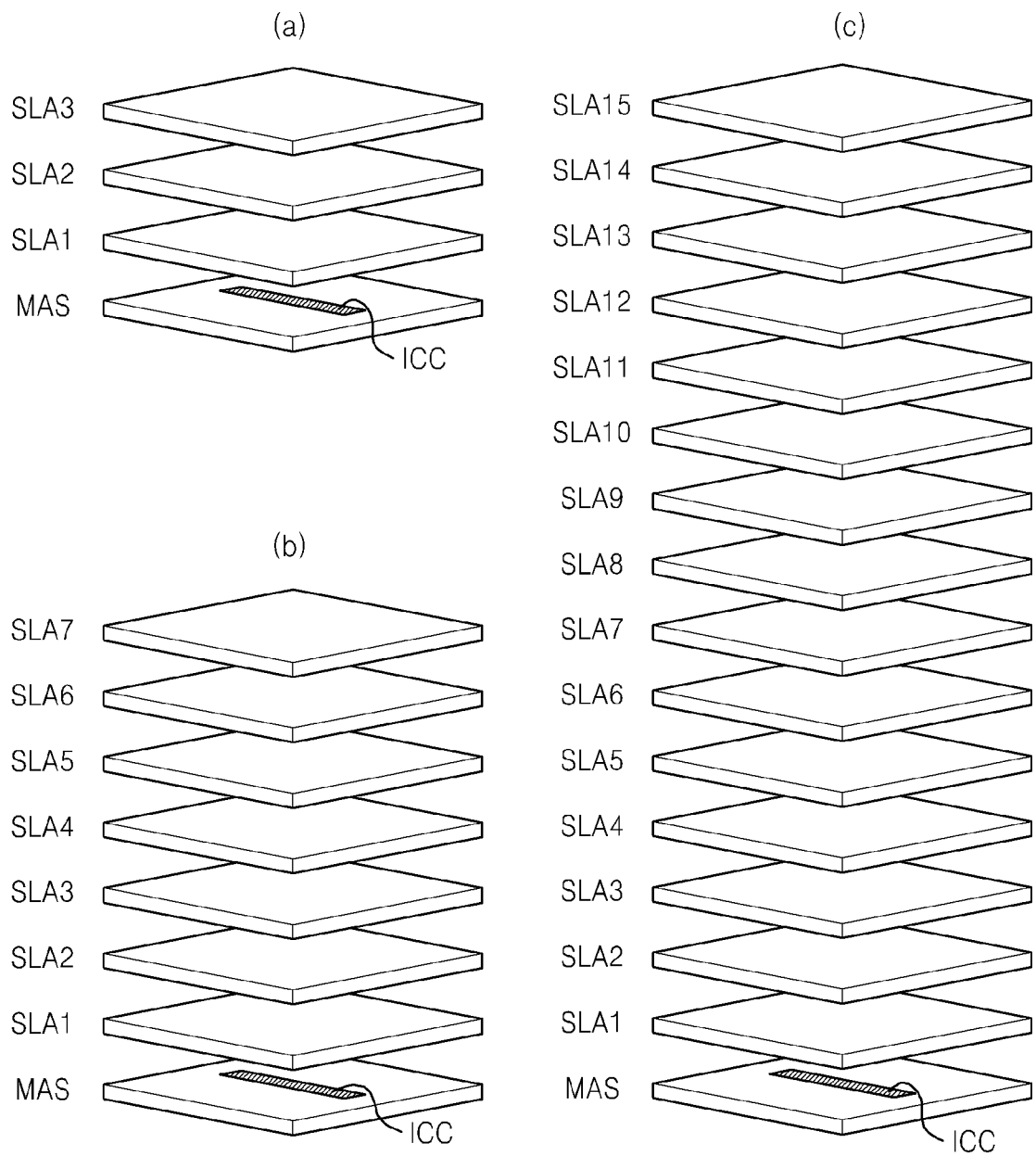
FIGS. 6A to 6C illustrate examples of a stacked structure of semiconductor memory chips as shown in FIGS. 2a-2c, according to exemplary embodiments.

Referring back to FIG. 2a, the number of the slave memory chips SLAs of the semiconductor memory device MD is not limited. For example, the semiconductor memory device MD may include three slave memory chips SLA1 to SLA3, in which transmitting and receiving of a signal is controlled via the interface control circuit ICC included in one master memory chip MAS, as illustrated in FIG. 6A. Alternatively, the semiconductor memory device MD may include seven slave memory chips SLA1 to SLAT as illustrated in FIG. 6B, or fifteen slave memory chips SLA1 to SLA15 as illustrated in FIG. 6C.

An interface control circuit ICC included in the master memory chip MAS may exchange a signal with corresponding slave memory chips SLAs via the through electrodes TSV of FIG. 2a connected to the slave memory chips SLAs. Each of the through electrodes TSV may pass through all of the slave chips, or in some embodiments, some or none of the through electrodes pass through all of the slave chips, and some or all pass only through a subset of the slave chips.

Figure 7:
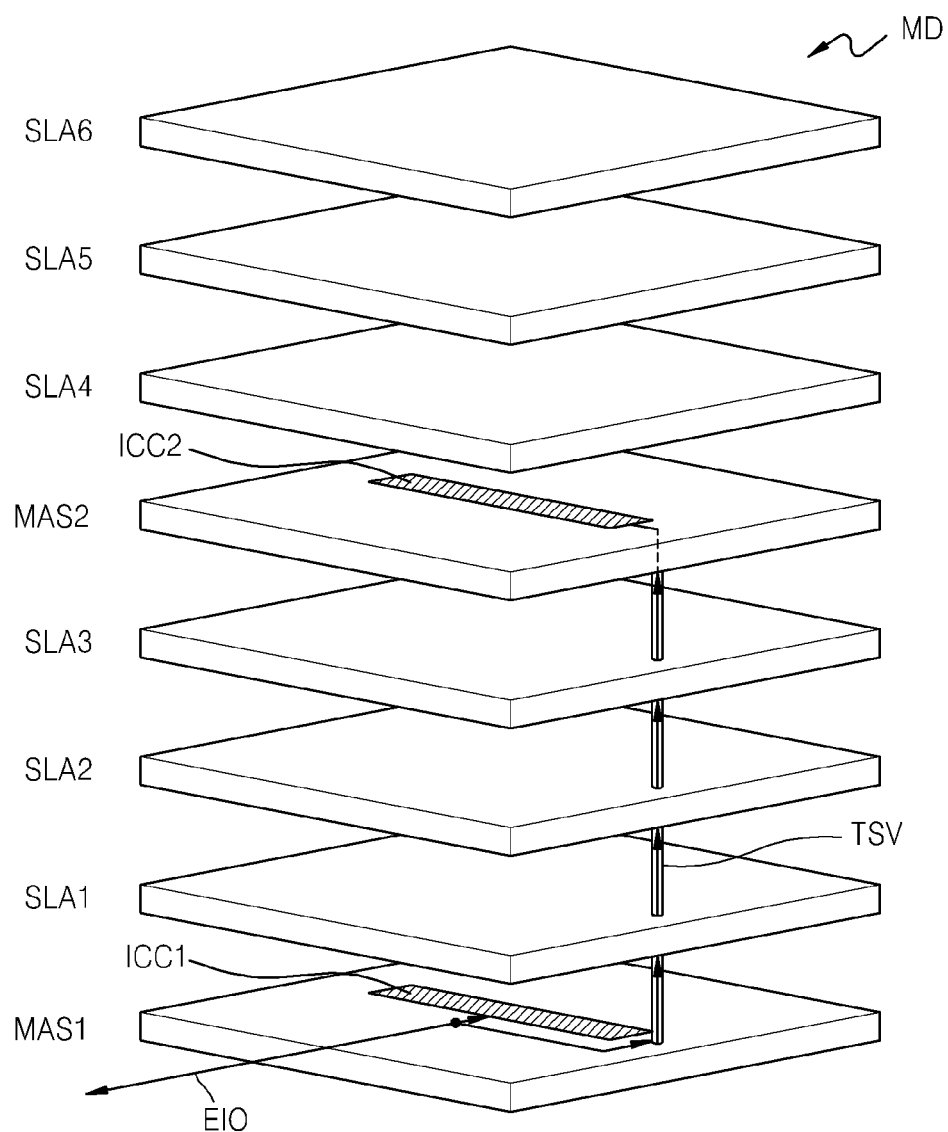
FIGS. 7 and 8 illustrate examples of a stacked structure of chips including master memory chips, according to an exemplary embodiment.
Figure 8:
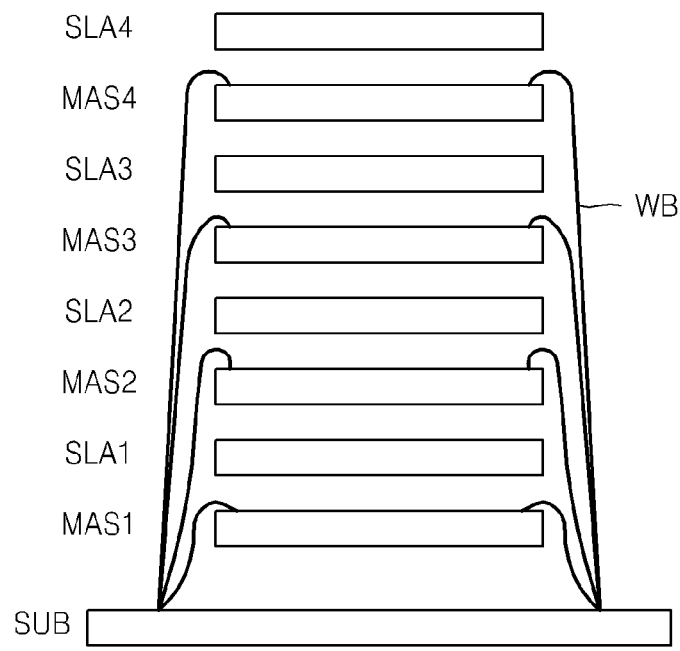

FIGS. 6A to 6C illustrate cases where a semiconductor memory device includes one master memory chip but the inventive concept is not limited thereto. In other embodiments, the semiconductor memory device MD of FIG. 2a may include a plurality of master memory chips. FIGS. 7 and 8 illustrate cases where a semiconductor memory device MD includes a plurality of master memory chips.

Referring to FIG. 7, the semiconductor memory device MD may include two master memory chips, e.g., a first master memory chip MAS1 and a second master memory chip MAS2. The first master memory chip MAS1 may include a first interface control circuit ICC1 that controls input of data to and output of data from the first master memory chip MAS1 and first to third slave memory chips SLA1, SLA2, and SLA3. Similarly, the second master memory chip MAS2 may include a second interface control circuit ICC2 that controls input of data to and output of data from the second master memory chip MAS2 and fourth to sixth slave memory chips SLA4, SLA5, and SLA6.

The second master memory chip MAS2 may be disposed on the third slave memory chip SLA3 furthest from the first master memory chip MAS1 from among the slave memory chips SLA1 to SLA3, in which input and output of data are controlled by the first interface control circuit ICC1. The second master memory chip MAS2 may be connected to the first master memory chip MAS1 on a substrate SUB (e.g., a package substrate, not shown in FIG. 7) via a transmission through electrode TRA so as to exchange a signal with the external circuit MCT of FIG. 1 via the external I/O unit EIO of FIG. 1.

Referring to FIG. 8, the semiconductor memory device MD may include, for example, four master chips MAS1 to MAS4 unlike in FIG. 7. Also, unlike in FIG. 7, four slave memory chips SLA1 to SLA4 may correspond to four interface circuits ICC1 to ICC4 included in the master memory chips MAS1 to MAS4 of FIG. 8, respectively. In the semiconductor memory device MD, the master chips MAS1 to MAS4 may be individually mounted on the substrate SUB and electrically connected via wire bonding WB.

When one semiconductor memory device includes a plurality of master memory chips, different identifiers may be assigned to the master memory chips, respectively, so that only a master memory chip assigned a desired identifier may operate at a certain time, thereby preventing the master memory chips from being activated simultaneously. Such controlling may be performed by the memory controller MCT of FIG. 1.

A case where an interface control circuit ICC as illustrated in FIG. 1 is included in a master memory chip from among a stacked structure of semiconductor memory chips, has been described but is not limited thereto.

Figure 9:
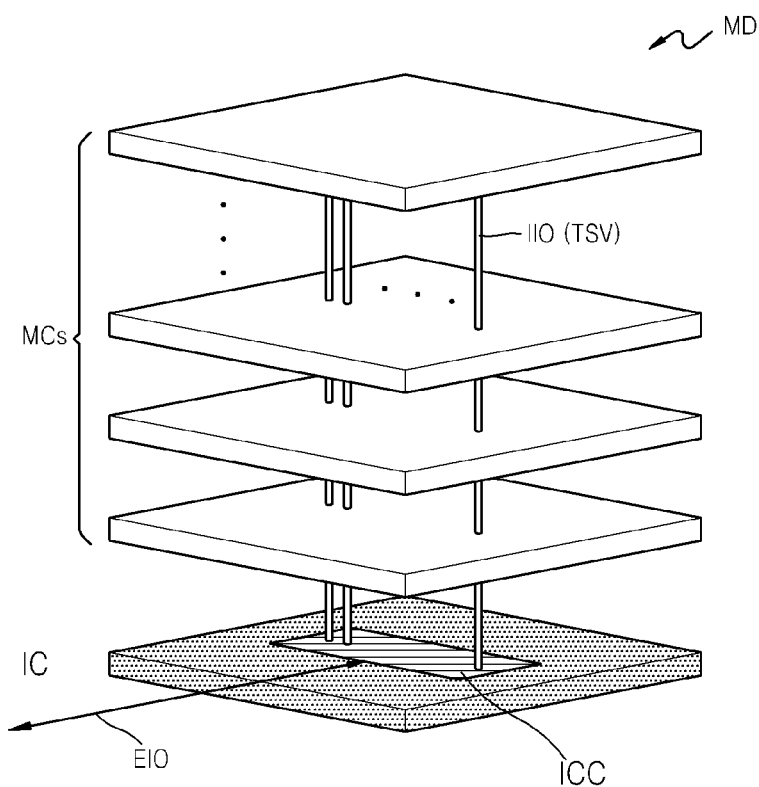
FIG. 9 illustrates a structure of the interface control circuit included in the semiconductor memory device of FIG. 1 according to another exemplary embodiment.

For example, referring to FIG. 9, the interface control circuit ICC may be included in an interface chip IC separately from a stacked structure of semiconductor memory chips MCs. The interface chip IC may be mounted on the substrate SUB of FIG. 8 and may exchange a signal with the semiconductor memory chips MCs via a plurality of through electrodes TSV.

A number of semiconductor memory chips to be included in the semiconductor memory device MD of FIG. 9, is also not limited. For example, the semiconductor memory device MD may include four semiconductor memory chips MC1 to MC4 as illustrated in FIG. 10A, may include eight semiconductor memory chips MC1 to MC8 as illustrated in FIG. 10B, may include sixteen semiconductor memory chips MC1 to MC16 as illustrated in FIG. 10C, or may include other numbers of semiconductor memory chips.

Figure 11:
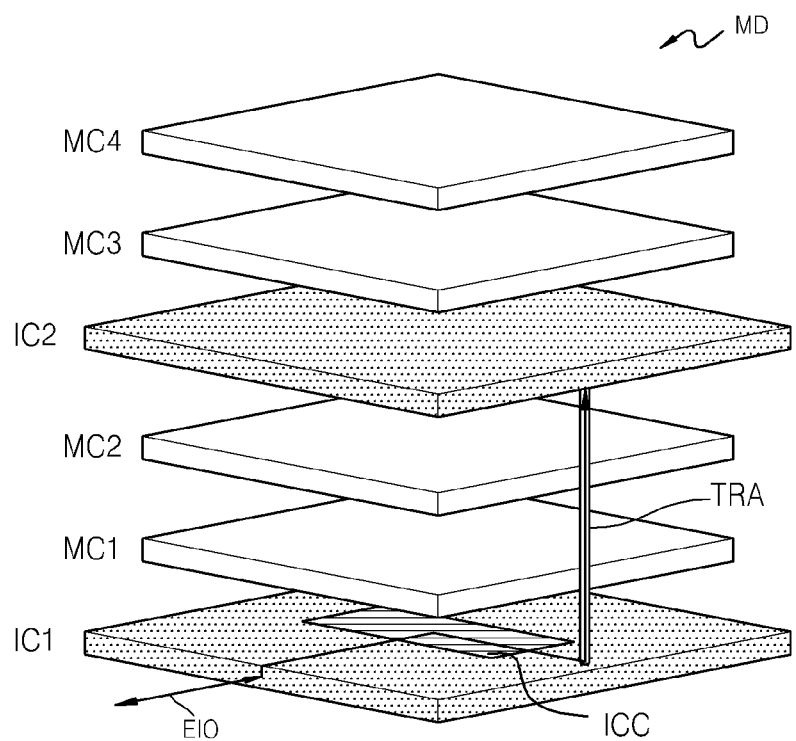
FIG. 11 illustrates a case where a semiconductor memory device includes a plurality of interface chips as shown in FIG. 9, according to one embodiment.

FIG. 9 illustrates a case where the semiconductor memory chip MD includes one interface chip IC, but the inventive concept is not limited thereto and the semiconductor memory chip MD may include a plurality of interface chips IC. FIG. 11 illustrates a semiconductor memory device MD that includes, for example, two interface chips IC1 and IC2.

Referring to FIG. 11, the second interface chip IC2 may be disposed on a semiconductor memory chip MC2, in which input and output of a signal is controlled by the first interface chip IC1. In this case, the second interface chip IC2 may be connected to the first interface chip IC1 on a substrate (not shown) via a transmission through electrode TRA so as to exchange a signal with an external circuit via an external I/O unit EIO.

Figure 12:
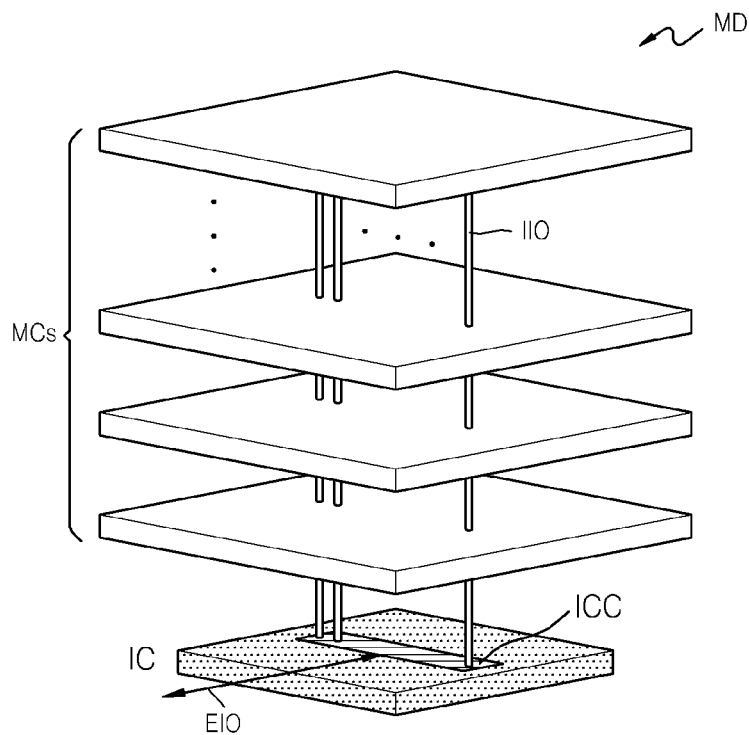
FIGS. 12 and 13 illustrate various shapes of the interface chip of FIG. 9, according to exemplary embodiments.

Referring back to FIG. 9, the interface chip IC shown in FIG. 9 is the same as the semiconductor memory chips MCs in terms of size, but may be smaller than the semiconductor memory chips MCs, as illustrated in FIG. 12. For example, in one embodiment, the interface chip IC may not include the storage region ARY of FIG. 1 included in the semiconductor memory chips MCs. However, even though the interface chip IC may be smaller than the semiconductor memory chips MCs, the semiconductor memory chips MCs may be stably disposed on the interface chip IC.

Figure 13:
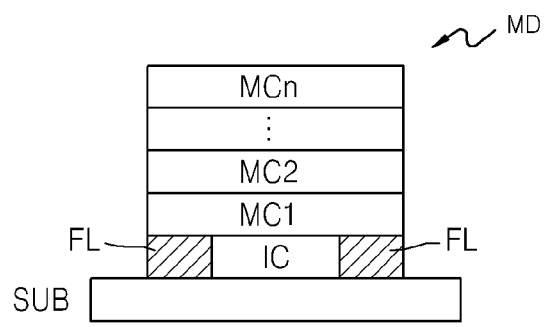

To this end, referring to FIG. 13, in a semiconductor memory device MD, a filler FL may be present between a substrate SUB and a first semiconductor memory chip MC1 nearest to an interface chip IC. The filler FL may be an organic material, such as polymer, and may be located at the same level as the interface chip IC and adjacent to the side surfaces of interface chip IC. In one embodiment, the filler FL surrounds the interface chip IC on all of its sides. The filler may also serve as a heat dissipater and may include, for example, one or more solder balls or metal pillars to assist in dissipating heat from the semiconductor memory device MD.

Figure 14:
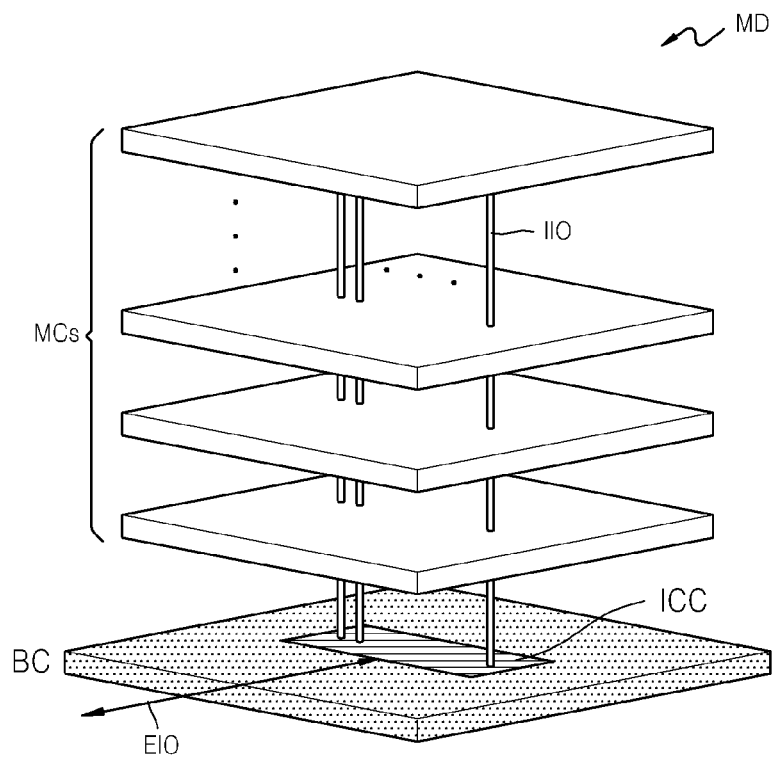
FIG. 14 illustrates a case where the interface control circuit of FIG. 1 is included in a buffer chip BC, according to an exemplary embodiment.

FIG. 14 illustrates a case where the interface control circuit ICC of FIG. 1 is included in a buffer chip BC, according to an exemplary embodiment. Referring to FIG. 14, in a semiconductor memory device MD according to one embodiment, the interface control circuit ICC may be included in a buffer chip BC that is disposed separately from a stacked structure of semiconductor memory chips MCs and buffer data transmitted or received via an internal I/O unit IIO or an external I/O unit EIO. The semiconductor memory device MD of FIG. 14 may have a structure as illustrated in one of FIGS. 9 to 13.

The interface control circuits illustrated in FIGS. 2 to 14 may control interfacing between an internal I/O unit and an external I/O unit that transmit or receive a signal according to a first I/O type and a second I/O type, respectively, but are not limited to the above description.

An interface control circuit of a semiconductor memory device according to one embodiment may have a structure and a function for preventing the performance of a semiconductor memory chip from being degraded, caused by being excessively accessed from among a stacked structure of semiconductor memory chips or for preventing a coupling phenomenon or an error from occurring between the stacked structure of semiconductor memory chips, as will be described in detail below.

Figure 15:
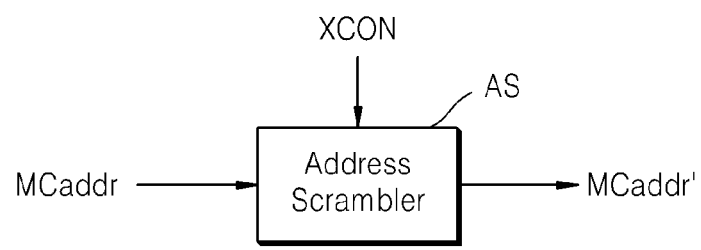
FIG. 15 is a block diagram of an address scrambler included in the interface control circuit of FIG. 1, according to an exemplary embodiment.

FIG. 15 is a block diagram of an address scrambler AS included in the interface control circuit ICC of FIG. 1, according to one exemplary embodiment.

If a semiconductor memory device MD includes a stacked structure of semiconductor memory chips MCs as illustrated in FIG. 1 and a particular semiconductor memory chip MC or region of a semiconductor chip (i.e., bank, block, or particular wordline or group of wordlines) is accessed more often than the other semiconductor memory chips MCs or regions, then the performance of only the particular semiconductor memory chip or region may be degraded, due to overheating or overuse. As such, degradation in the performance of all or a part of a semiconductor memory chip MC may lower the reliability of the semiconductor memory device MD. To prevent such a problem, a semiconductor memory device MD according to one embodiment may include an address scrambler AS that monitors a chip address MCaddr indicating a semiconductor memory chip to be accessed, scrambles the chip address MCaddr of the semiconductor memory chip (e.g., translates the chip address to a different chip address), and outputs a chip address MCaddr of another semiconductor memory chip when the semiconductor memory chip is accessed more often than the other semiconductor memory chips. The address scrambler AS is not limited to changing chip addresses, and in addition to scrambling the addresses of the different chips of a stack of chips (i.e., the chip addresses), the semiconductor memory device MD may scramble addresses of portions of the chips, such as individual banks within chips.

In one embodiment, it may be assumed that the stacked structure of semiconductor memory chips MCs have a storage region having the same size and structure. That is, if a chip address is changed, the same storage region of another memory chip corresponding to an address to be accessed may be accessed.

Figure 16:
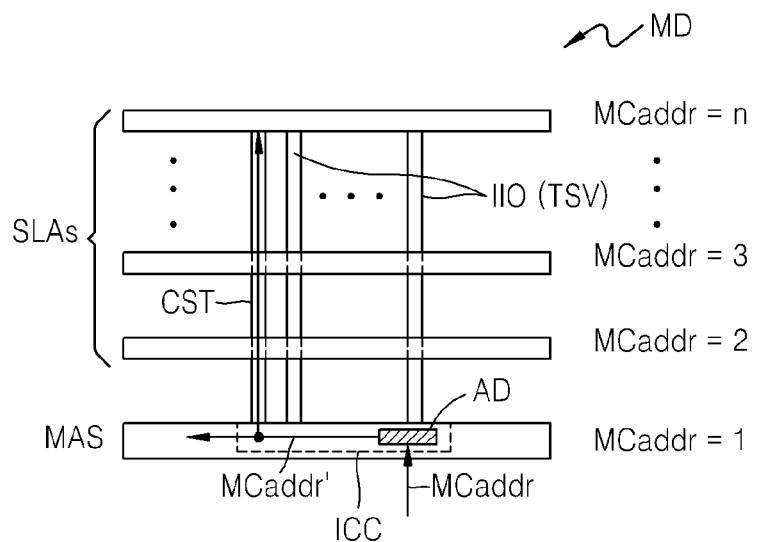
FIG. 16 illustrates a semiconductor memory device that includes the address scrambler of FIG. 15, according to an exemplary embodiment.

FIG. 16 illustrates a semiconductor memory device MD that includes the address scrambler AS of FIG. 15, according to an exemplary embodiment. Referring to FIG. 16, the address scrambler AS of FIG. 15 may include an interface control circuit ICC included in a master memory chip MAS as illustrated in FIG. 3. Referring to FIG. 16, chip addresses MCaddrs having different values are assigned to a plurality of semiconductor memory chips, respectively. For example, a chip address MCaddr of the master memory chip MAS may be '1' and a chip address MCaddr of a first slave memory chip SLAT may be '2'.

The address scrambler AS may scramble the chip addresses MCaddrs having different values assigned to the plurality of semiconductor memory chips and output changed chip addresses MCaddrs', in response to a control signal XCON. In one embodiment, a controller may track the free memory space in different chips, and if the controller determines that one region of a first chip (e.g., a bank, block, or wordline) is being overused and a same region of a second chip is available (i.e., has no data stored in it), the controller can scramble the chip addresses MCaddrs into changed chip addresses MCaddrs' and the data in the region of the first chip can be written to the same region on the second chip so that during subsequent accesses, the second chip is accessed rather than the first chip, reducing the usage of the overused region of the first chip. Although address changes above are described in terms of changing chip addresses, other addresses, such as memory bank addresses among different chips or within the same chip, can be changed as well.

In another embodiment, instead of tracking free memory space, when a region of a first chip is determined to be overused, even if a same region of a second chip has data stored in it, a third region of one of the chips or a third chip can be used as a temporary storage (i.e., a buffer), so that data stored in the second chip could be stored in the buffer, and then data from the first chip can be moved to the second chip, data in the buffer can be moved to the first chip, and then the chip addresses MCaddrs can be scrambled to output changed chip addresses MCaddrs' so those two memory regions are swapped when subsequently accessing memory.

Although not illustrated in FIG. 16 and other drawings, the interface control circuit ICC may transmit a chip address MCaddr' received from the address scrambler AS to a chip selection through electrode CST from among a plurality of through electrodes TSVs. However, a chip address MCaddr' may be transmitted to the master memory chip MAS that includes the interface control circuit ICC via other means, such as an internal wire (not shown) in the master memory chip MAS. FIG. 16 illustrates that the chip selection through electrode CST is a leftmost through electrode from among the plurality of through electrodes but is not limited thereto.

FIG. 16 illustrates that only one chip selection through electrode CST passing through the stack of chips is included in the semiconductor memory device MD but a number of the chip selection through electrodes CST passing through the stack of chips is not limited and may be determined according to the number of bits of a chip address MCaddr.

The address scrambler AS according to one exemplary embodiment may scramble a chip address in one of various forms as will be described above with reference to FIGS. 17 and 18.

FIGS. 17A and 17B illustrate scrambling methods that may be employed by the address scrambler AS of FIG. 15, according to certain embodiments. Referring to FIG. 17A, if the address scrambler AS does not perform scrambling, the address scrambler AS outputs a chip address MCaddr' having the same value as a chip address MCaddr input thereto. For example, if a chip address MCaddr of a first memory chip is '1', then a chip address MCaddr' of the first memory chip output from the address scrambler AS is also '1'.

Referring to FIG. 17B, the address scrambler AS may scramble a chip address MCaddr and output another chip address MCaddr', in response to a control signal XCON, as indicated with a dotted line. For example, the address scrambler AS may scramble a chip address MCaddr ('4') of a fourth memory chip and output a chip address MCaddr' ('3') of a third memory chip, and may scramble the chip address MCaddr ('3') of the third memory chip and output the chip address MCaddr' ('4') of the fourth memory chip. Also, the address scrambler AS may scramble a chip address MCaddr ('n−1') of an $(n-1)^{th}$ memory chip and output a chip address MCaddr' ('n') of an $(n)^{th}$ memory chip, and may scramble the chip address MCaddr ('n') of the $(n)^{th}$ memory chip and output the chip address MCaddr' ('n−1') of the $(n-1)^{th}$ memory chip.

That is, in one embodiment, the address scrambler AS may scramble between an even-numbered chip address and an odd-numbered chip address, in response to a control signal XCON, but is not limited thereto.

Figure 18:
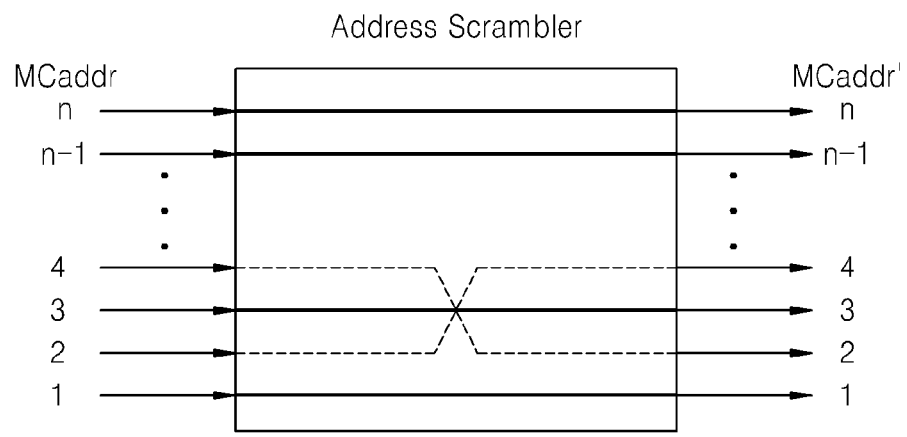
FIG. 18 illustrates a scrambling method that may be employed by the address scrambler, according to another exemplary embodiment.

FIG. 18 illustrates a scrambling method that may be employed by the address scrambler AS of FIG. 15, according to another embodiment. Referring to FIG. 18, the address scrambler AS may scramble a chip address MCaddr ('4') of a fourth memory chip and output a chip address MCaddr' ('2') of a second memory chip, and scramble the chip address MCaddr ('2') of the second memory chip and output the chip address MCaddr' ('4') of the fourth memory chip, as indicated with a dotted line. In addition, an address scrambler according to other embodiments may perform scrambling according to one of the other various methods. For example, scrambling may not merely change two input chip addresses MCaddr so that their respective output chip addresses MCaddr' are swapped with each other. Rather, three or more input addresses may be scrambled to result in three or more different output addresses, in different ways.

In the embodiment described above, scrambling of an address scrambler is performed according to a control signal XCON. In one embodiment, the control signal XCON for controlling an address scrambler AS may be generated using a counter CT included in an interface control circuit ICC, as illustrated in FIG. 19 or 20.

Figure 19:
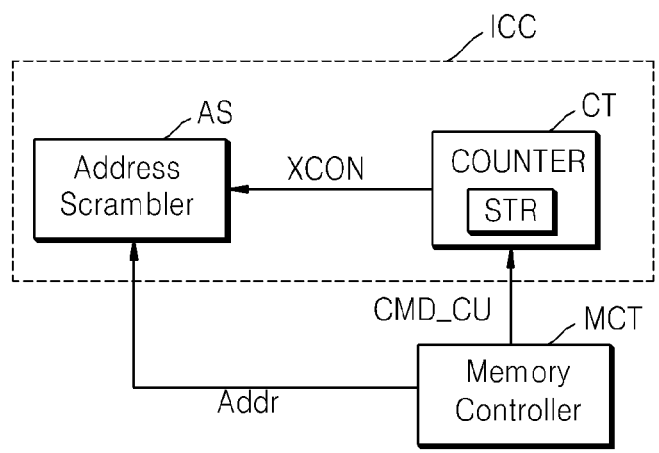
FIGS. 19 and 20 are block diagrams illustrating methods of generating a control signal to be transmitted to the address scrambler of FIG. 15, according to exemplary embodiments.

Referring to FIG. 19, when a memory controller MCT outside a semiconductor memory device MD transmits an address Addr to the semiconductor memory device MD, the memory controller MCT may transmit a counting command CMD_CU to the counter CT in the interface control circuit ICC. That is, the memory controller MCT may monitor one or more chip addresses to be transmitted. When the counting command CMD_CU is input to the counter CT a predetermined number of times or more for a particular address, the counter CT may generate a control signal XCON and transmit it to an address scrambler AS. The control signal XCON may instruct the address scrambler AS to scramble that address with a different address (e.g., it may perform an address swap with another chip, such as a chip at an address that has a low count by the counter CT).

Figure 20:
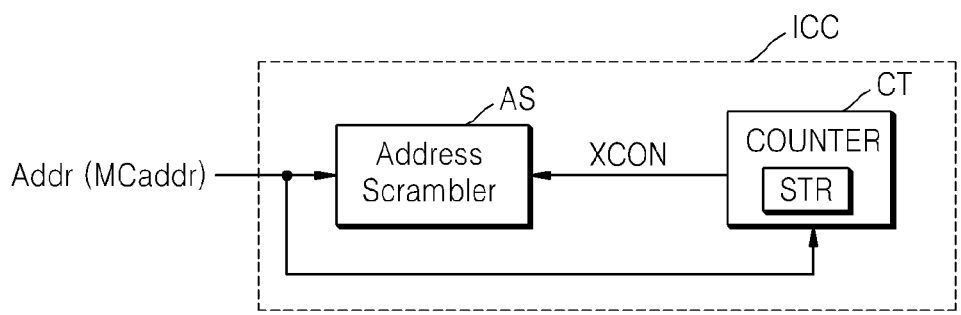

Otherwise, referring to FIG. 20, an address Addr may be input directly to a counter CT included in an interface control circuit ICC. As such, the counter CT may monitor the address Addr as well as other addresses, and generate a control signal XCON and transmit the control signal XCON to an address scrambler AS when the address Addr is input to the counter CT a predetermined number of times or more.

The counting described above in connection with FIGS. 19 and 20 may count an address according to different types of processes. In particular, in one embodiment, the counting may be based on memory accesses that typically result in increased heat produced by the semiconductor memory device. For example, the ICC may base the number of counts on a frequency of access (i.e., counts per unit time) of memory locations of the memory chips of the stack of memory chips. Alternatively, the ICC may base the number of counts on a number of sequential writes to or accesses of the at least one memory location (e.g., in the case that writes/accesses of the same location occur repeatedly in succession). Other types of counts may be used. In addition, counts may be generated based on accumulated access of a particular semiconductor memory chip, or a particular bank of a particular semiconductor memory chip.

In one embodiment, the control signal XCON may include information regarding a scrambling method, together with information indicating whether scrambling is to be performed. For example, the control signal XCON may indicate whether the scrambling method illustrated in FIG. 17B or the scrambling method illustrated in FIG. 18 may be used to perform scrambling.

In one embodiment, the counters CT illustrated in FIGS. 19 and 20 may include a storage region STR, e.g., an anti-fuse, an E-fuse, or a non-volatile memory device, and store a counting result for different addresses therein, so that the counting result may be retained even when power cutoff occurs in a semiconductor memory device according to one embodiment. Also, in one embodiment, existing circuitry used to re-route writes/accesses to addresses that have become defective may be used to implement the scrambling, based on the counts and the control signal XCON described above.

Figure 21:
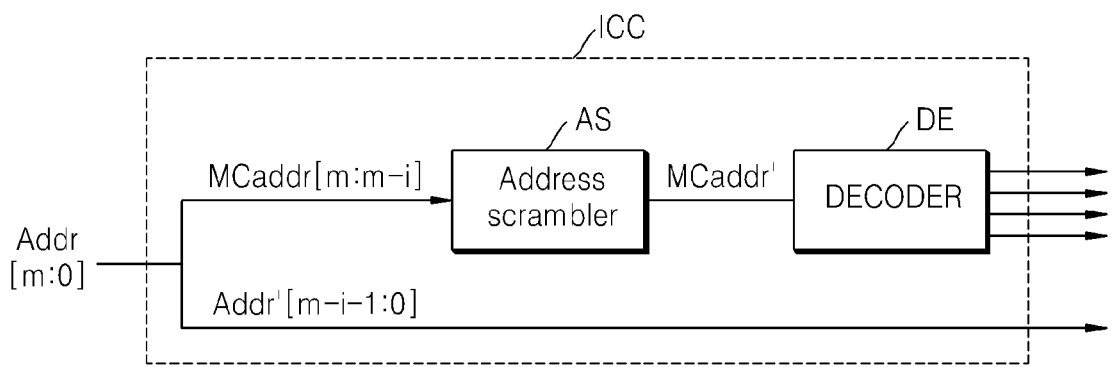
FIG. 21 is a block diagram of an interface control circuit that includes the address scrambler of FIG. 15, according to an exemplary embodiment.

Referring back to FIG. 15, it has been described that the address scrambler AS receives a chip address. In addition, the interface control circuit ICC that includes the address scrambler AS may further include a decoder DE for decoding an external address Addr received via the external I/O unit EIO of FIG. 1, as illustrated in FIG. 21. Referring to FIG. 21, a memory address Addr may include, for example, predetermined bit(s) as external, chip address bits MCaddr (e.g., in an address having bits [m:0], most significant bits [m:m−i] may comprise the external chip address bits MCaddr), and the remaining bits as an internal address Addr'[m−i−1:0] (m denotes a natural number, and i denotes a natural number equal to or less than m). The ICC may extract the external chip address bits [m:m−i] and transmit those bits to a scrambler AS. The scrambler AS may then scramble the external chip address bits in accordance with the embodiments described above, and output a scrambled chip address MCaddr'. This address may be input into a decoder DE to select a chip to access. In addition, the internal address bits Addr' may be passed through the ICC without being scrambled. The decoded chip address bits and the internal address bits may then be sent to the memory chips and used to access the chips. Although chip addresses are described above, other addresses such as bank addresses, or a combination of chip addresses and bank addresses, may be used as an alternative.

Figure 22A:
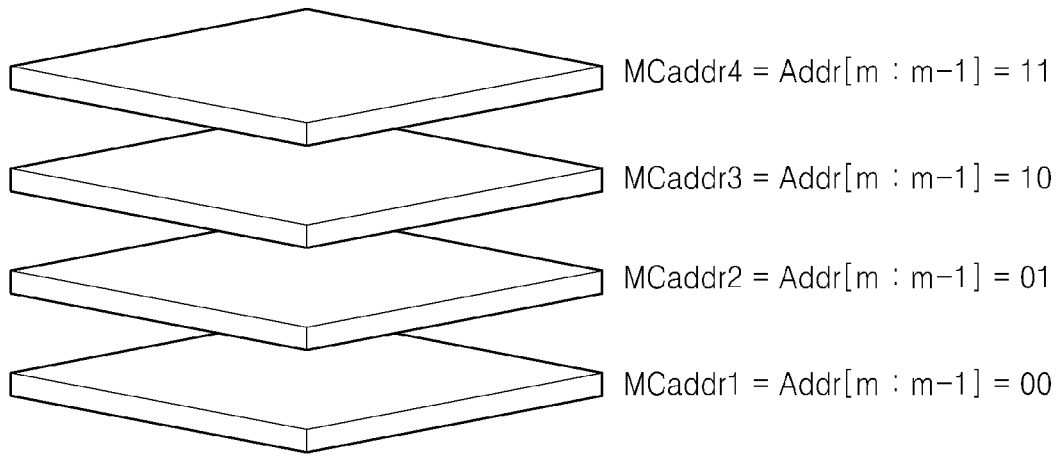
FIGS. 22A and 22B illustrate examples of a chip address that may be included in a received address illustrated in FIG. 19, according to exemplary embodiments.
Figure 22B:
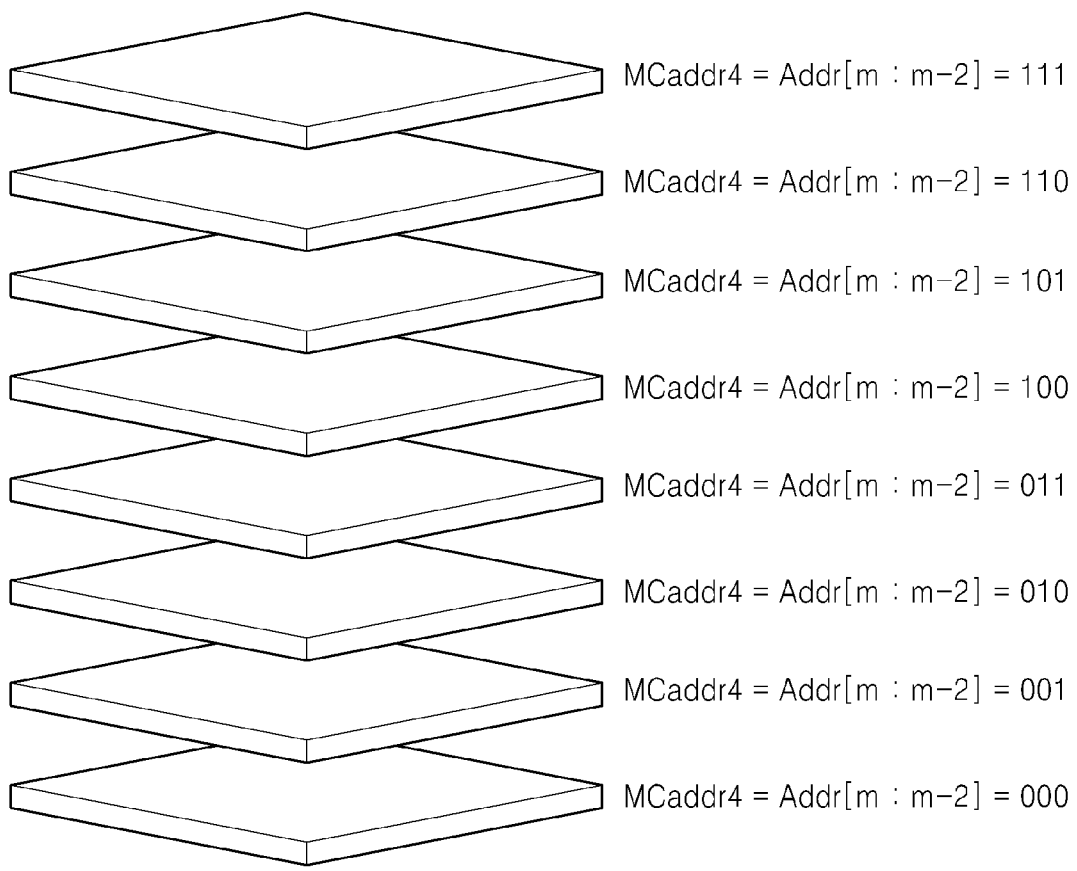

FIGS. 22A and 22B illustrate examples of a chip address MCaddr that may be included in the address Addr illustrated in FIG. 19, according to certain embodiments. Referring to FIG. 22A, a chip address MCaddr of each of a stacked structure of four semiconductor memory chips MCs may be expressed with two most significant bits of the address Addr. For example, a chip address MCaddr1 of a first memory chip MC1 may be '00' that is two most significant bits Addr[m:m−1] of the address Addr, and a chip address MCaddr2 of a second memory chip MC2 may be '01' that is two most significant bits Addr[m:m−1] of the address Addr. Similarly, a chip address MCaddr3 of a third memory chip MC3 may be '10' that is two most significant bits Addr[m:m−1] of the address Addr, and a chip address MCaddr4 of a fourth memory chip MC4 may be '11' that is two most significant bits Addr[m:m−1] of the address Addr.

Referring to FIG. 22B, a chip address MCaddr of each of a stacked structure of eight semiconductor memory chips MCs may be expressed with three most significant bits of the address Addr. For example, a chip address MCaddr1 of a first memory chip MC1 may be '000' that is three most significant bits Addr[m:m−2] of the address Addr, and a chip address MCaddr2 of a second memory chip MC2 may be '001' that is three most significant bits Addr[m:m−2] of the address Addr. A chip address MCaddr3 of a third memory chip MC3 may be '010' that is three most significant bits Addr[m:m−2] of the address Addr, and a chip address MCaddr4 of a fourth memory chip MC4 may be '011' that is three most significant bits Addr[m:m−2] of the address Addr. Similarly, a chip addresses MCaddr5 of a fifth memory chip MC5, a sixth chip addresses MCaddr6 of a sixth memory chip MC6, a chip addresses MCaddr7 of a seventh memory chip MC7, and a chip addresses MCaddr8 of an eighth memory chip MC8 may be '100', '101', '110', and '111' that are three most significant bits Addr[m:m−2] of the address Addr, respectively.

Figure 23:
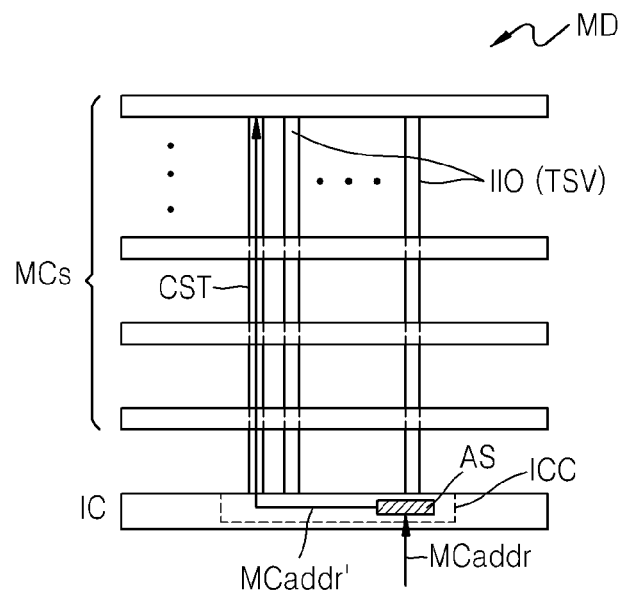
FIGS. 23 and 24 illustrate semiconductor memory devices that include the address scrambler of FIG. 15, according to exemplary embodiments.
Figure 24:
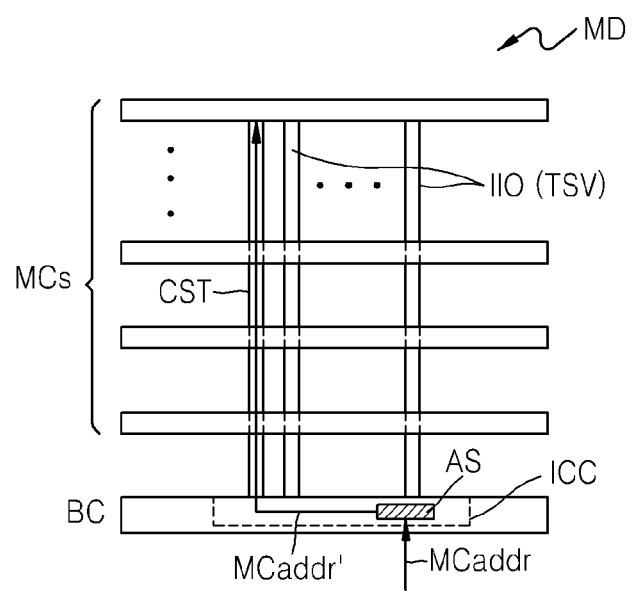

FIGS. 23 and 24 illustrate semiconductor memory devices MD that include the address scrambler AS of FIG. 15, according to exemplary embodiments. Referring to FIG. 23, the address scrambler AS may include an interface control circuit ICC included in an interface chip IC, as illustrated in FIG. 9. Referring to FIG. 24, the address scrambler AS may include an interface control circuit ICC included in a buffer chip BC as illustrated in FIG. 14.

Both the address scramblers AS included in the interface chip IC of FIG. 23 and the buffer chip BC of FIG. 24 may have the same structure and function as the address scrambler AS included in the master memory chip MAS. However, if the address scrambler AS is included in the interface chip IC or the buffer chip BC other than in the master memory chip MAS, chip addresses MCaddrs of all semiconductor memory chips may transmitted to a chip selection through electrode CST passing through the stack of chips.

As described above, a semiconductor memory device according to an exemplary embodiment may prevent an error from occurring therein, caused when a semiconductor memory chip is accessed excessively from among a stacked structure of semiconductor memory chips, by scrambling chip addresses of the semiconductor memory chips. Furthermore, the semiconductor memory device may prevent a bank from being accessed excessively from among banks of a stacked structure of semiconductor memory chips by scrambling bank addresses of the banks, as will be described below with reference to FIG. 25 or other drawings.

FIGS. 25A and 25B illustrate examples of the semiconductor memory device MD of FIG. 1, in which each of semiconductor memory chips includes a plurality of banks, according to certain exemplary embodiments. Referring to FIG. 25A, each of a stacked structure of semiconductor memory chips MC1, MC2, MC3, . . . , through to MCn includes two banks. For example, a first memory chip MC1 may include a first bank BK1 and a second bank BK2, and a second memory chip MC2 may include a third bank BK3 and a fourth bank BK4 but the inventive concept is not limited thereto. A semiconductor memory device according to one embodiment may include four or more banks for each of semiconductor memory chips as illustrated in FIG. 25B.

Figure 26:
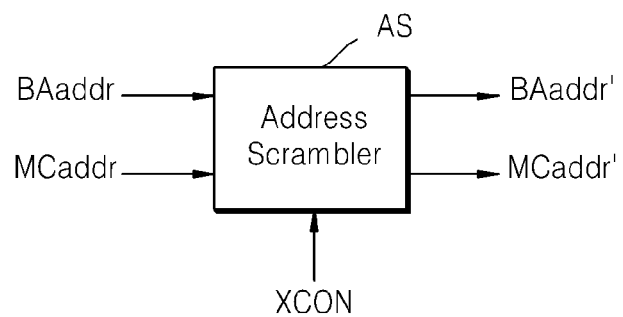
FIG. 26 is a block diagram of an address scrambler included in the semiconductor memory device of FIGS. 25A and 25B, according to another exemplary embodiment.

FIG. 26 is a block diagram of an address scrambler AS included in the semiconductor memory device MD of FIG. 25A or 25B, according to another exemplary embodiment. Referring to FIGS. 25 and 26, the address scrambler AS may perform scrambling on a chip address MCaddr and/or a bank address BAaddr. In other words, the address scrambler AS may perform scrambling on the bank address BAaddr as described above so as to prevent the performance of a bank from being degraded, caused when the bank is accessed excessively from among a plurality of banks.

For example, the address scrambler AS may perform an operation as illustrated in FIG. 27A when scrambling is not needed, and may perform scrambling in response to a control signal XCON as illustrated in FIG. 27B when scrambling is needed. That is, the address scrambler AS may scramble a bank address BAaddr ('3') of a third bank and output a bank address BAaddr' ('2') of a second bank, and may scramble the bank address BAaddr ('2') of a second bank and output the bank address BAaddr' ('3') of the third bank.

When an address scrambler according to one embodiment performs scrambling on the chip address MCaddr and/or the bank address BAaddr as illustrated in FIG. 27A, then the chip address MCaddr and/or the bank address BAaddr may be input to the address scrambler AS of FIG. 26, as illustrated in FIG. 28.

An address scrambler according to another exemplary embodiment may scramble an address of a first storage region A and output an address of another storage region B from among storage regions of a stacked structure of semiconductor memory chips, as illustrated in FIG. 29A or 29B. In this case, the first storage region A and the second storage region B may be located in different semiconductor memory chip (see FIG. 29A) or may be located in the same semiconductor memory chips (see FIG. 29B). The storage regions can be word lines, groups of wordlines, blocks, etc.

Figure 30:
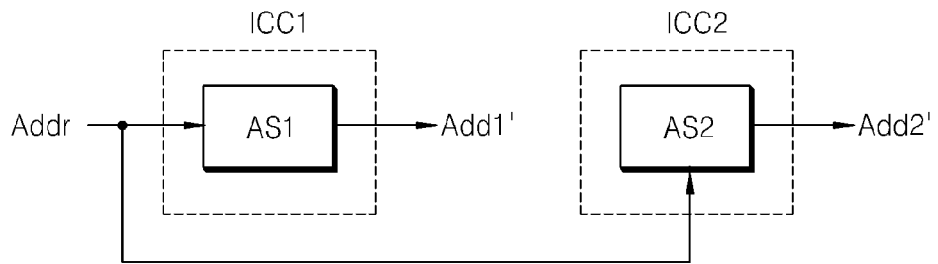
FIG. 30 is a block diagram of address scramblers included in a plurality of interface control circuits, respectively, according to an exemplary embodiment.

FIG. 30 is a block diagram of exemplary address scramblers included in a plurality of interface control circuits as illustrated in FIG. 7 or 10, respectively, according to one embodiment. Referring to FIG. 30, address scramblers AS1 and AS2 may be included in a plurality of interface control circuits ICC1 and ICC2, respectively. Referring to FIG. 30, when an address Addr is input to the first address scrambler AS1 from the outside, the first address scrambler AS1 may scramble addresses of semiconductor memory devices, the interfacing of which is controlled by the first interface control circuit ICC1. Similarly, when the address Addr is input to the second address scrambler AS2 from the outside, the second address scrambler AS2 may scramble addresses of semiconductor memory devices, the interfacing of which is controlled by the second interface control circuit ICC2.

As described above, an address scrambler according to certain embodiments may prevent a particular semiconductor memory chip, bank or storage region from being accessed excessively from among a stacked structure of semiconductor memory chips, banks or storage regions by scrambling a received address. However, the address translation described herein may also be used in systems that do not include a stack of chips or that do not include through substrate vias. For example, the address translation described above may be used in a semiconductor device that includes a stack of chips connected through wire bonding, or through a plurality of chips disposed on a board or substrate but not in a stacked configuration. In addition, the address translation may occur within a single chip, between different memory banks or different memory regions within the single chip. Nonetheless, the translation method is particularly useful in stacked chip packages to avoid the over-use of a particular chip or particular bank or region from rendering the entire package defective or inoperable.

Figure 31:
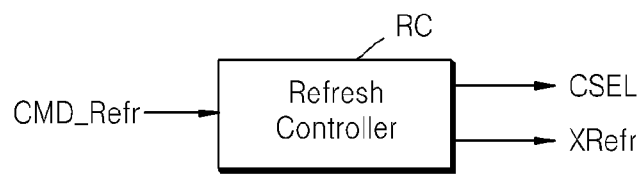
FIG. 31 is a block diagram of a refresh controller included in the interface control circuit of FIG. 1, according to an exemplary embodiment.

FIG. 31 is a block diagram of a refresh controller RC included in the interface control circuit ICC of FIG. 1, according to an exemplary embodiment. In one embodiment, the stacked structure of semiconductor memory chips MCs of FIG. 1 may be a Dynamic Random Access Memory (DRAM). In this case, the semiconductor memory chips need to be refreshed periodically. However, noise may occur when the stacked structure of semiconductor memory chips MCs are refreshed simultaneously. To reduce the noise, in one embodiment, the interface control circuit ICC includes a refresh controller RC that refreshes the stacked structure of semiconductor memory chips MCs at different times, in response to a refresh command CMD_Refr.

Figure 32:
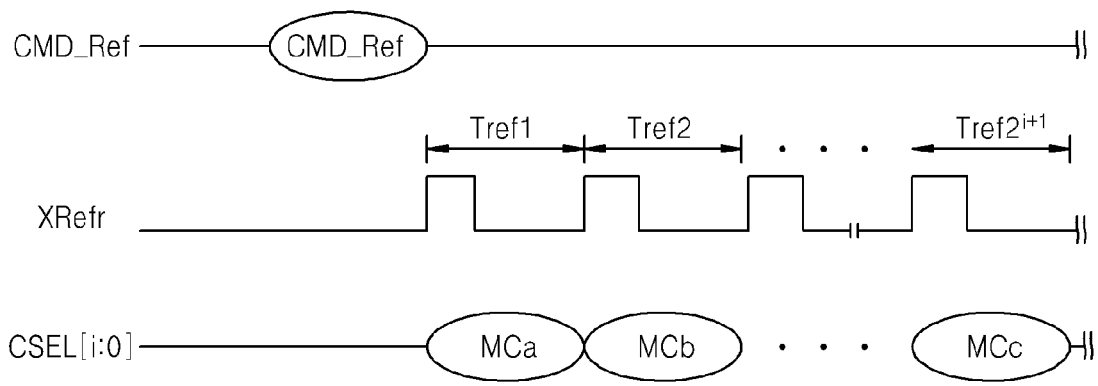
FIG. 32 is a timing diagram illustrating operations of the refresh controller of FIG. 31, according to an exemplary embodiment.

Referring to FIG. 32, if the refresh command CMD_Refr is input to the refresh controller RC of FIG. 31, then in one embodiment, the refresh controller RC may generate a refresh signal XRefr consisting of pulse signals generated sequentially, and a chip selection signal CSEL that activates a semiconductor memory chip MCa, MCb, . . . , or MCc for a pulse duration Tref1, Tref2, . . . , or Tref$2^{i+1}$ of a corresponding pulse signal of the refresh signal XRefr, i.e., for a time period from a rising edge of the corresponding pulse signal to a rising edge of a subsequent pulse signal. Here, a, b, and c denote natural numbers each being less than or equal to the number of the stacked structure of semiconductor memory chips.

Exemplary refresh controllers according to various embodiments will now be described in greater detail with reference to the accompanying drawings.

Figure 33:
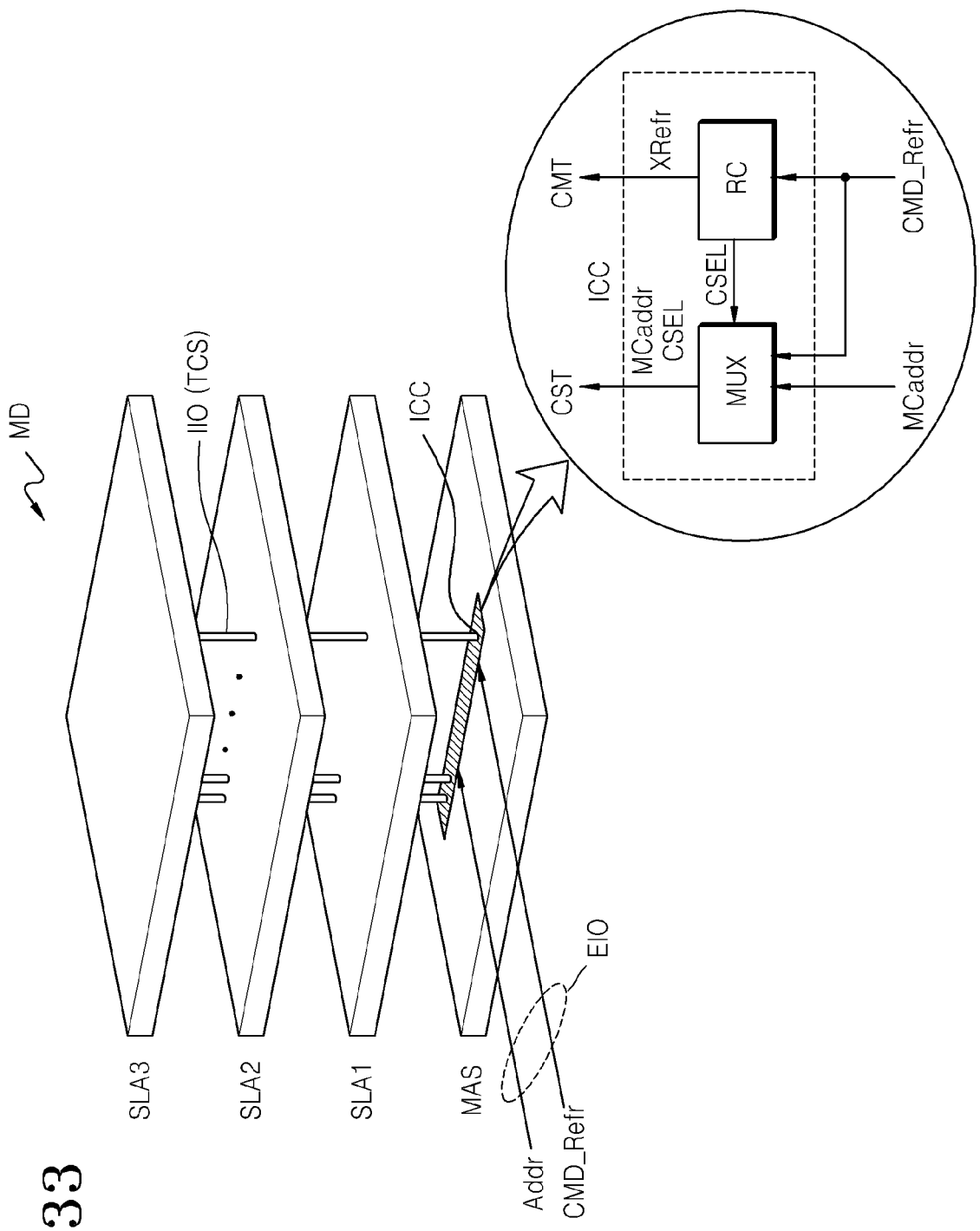
FIG. 33 illustrates a semiconductor memory device that includes the refresh controller of FIG. 31, according to an exemplary embodiment.

Referring to FIG. 33, a semiconductor memory device MD according to one embodiment may include one master memory chip MAS having an interface control circuit ICC, and three slave memory chips SLA1 to SLA3. As described above, when a refresh command CMD_Refr is input to a refresh controller RC illustrated in FIG. 33 according to one embodiment, the refresh controller RC may generate a refresh signal XRefr consisting of pulse signals generated sequentially, and a chip selection signal CSEL that activates a semiconductor memory chip for a pulse duration of a corresponding pulse signal of the refresh signal XRefr.

In this case, the refresh signal XRefr is transmitted to a command through electrode CMT passing through a stack of chips and that transmits a command, and the chip selection signal CSEL is transmitted to a chip selection through electrode CST passing through the stack of chips and that transmits chip address MCaddrs, via a selector MUX. In an embodiment where the interface control circuit ICC is included in the master memory chip MAS as illustrated in FIG. 33, the chip selection signal CSEL for the master memory chip MAS may be transmitted via an internal wire (not shown).

In one embodiment, the selector MUX is included in the interface control circuit ICC. If refreshing is performed, then the selector MUX receives the chip selection signal CSEL from the refresh controller RC and transmits it to the chip selection through electrode CST. Then a semiconductor memory device corresponding to the chip selection signal CSEL is activated from among semiconductor memory chips MAS, SLA1, SAL2, and SLA3 that receive the chip selection signal CSEL via the chip selection through electrode CST. If refreshing is not performed, the selector MUX transmits the chip address MCaddr to the chip selection through electrode CST.

Although not shown in FIG. 33, the interface control circuit ICC may further include a decoder such as the decoder DE of FIG. 21 that decodes the scrambled chip address.

Figure 34:
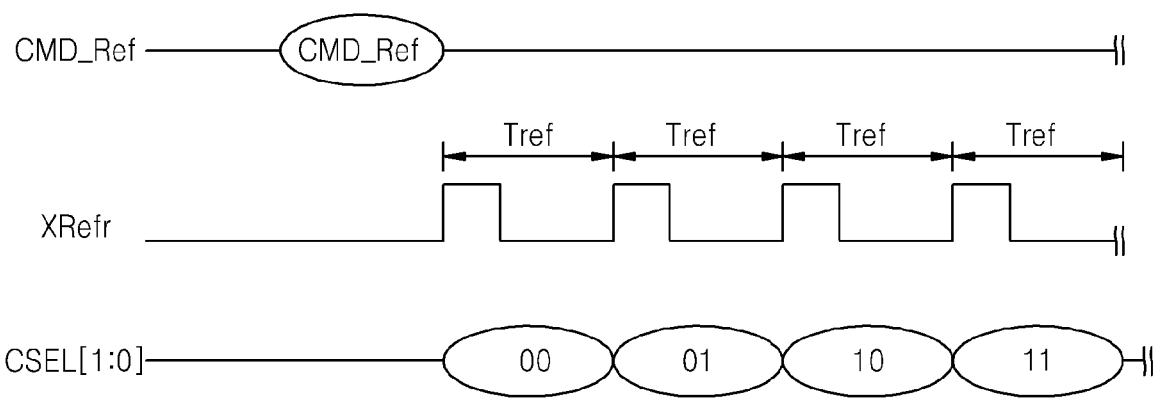
FIGS. 34 to 37 are timing diagrams illustrating operations of the refresh controller of FIG. 33, according to exemplary embodiments.

If the refresh command CMD_Refr is input to the refresh controller RC of FIG. 33, then the refresh controller RC may output a refresh signal XRefr such as illustrated in FIG. 34 that consists of pulse signals that have the same pulse duration Tref and the number of which is equal to the number of semiconductor memory chips MAS, SLA1, SAL2, and SLA3. Then a plurality of chip selection signals CSEL corresponding to a stacked structure of the four semiconductor memory chips MAS, SLA1, SAL2, and SLA3, respectively, are generated sequentially according to the refresh signal XRefr.

Each of the chip selection signals CSEL may be a 2-bit signal. If the four semiconductor memory chips MAS, SLA1, SLA2, and SLA3 are assigned chip identifiers (chip addresses), e.g., '00', '01', '10', and '11', respectively, as illustrated for example in FIG. 22A, then the chip selection signals CSEL corresponding thereto are also assigned '00', '01', '10', and '11', respectively, as illustrated in FIG. 34.

Figure 35:
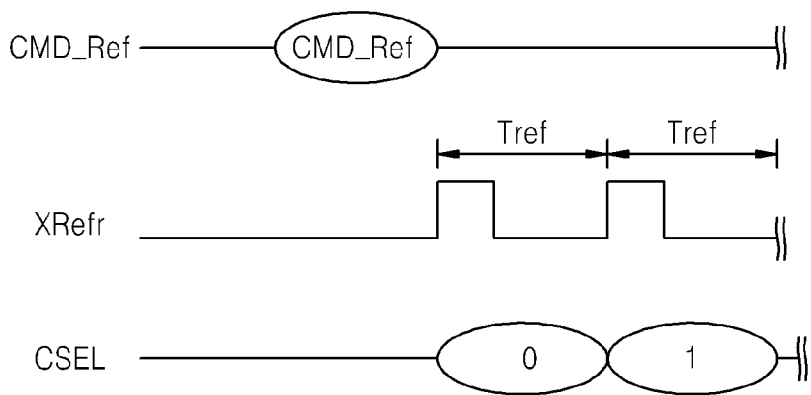

In another embodiment, if the refresh command CMD_Refr is input to the refresh controller RC of FIG. 33, then the refresh controller RC may output a refresh signal XRefr, such as illustrated in FIG. 35, that consists of two pulse signals that have the same pulse duration Tref and the number of which is less than the number of semiconductor memory chips MAS, SLA1, SAL2, and SLA3. In this case, two chip selection signals CSEL corresponding to the two pulse signals of the refresh signal XRefr are generated. That is, the refresh controller RC may refresh two semiconductor memory chips simultaneously and may then refresh the other two semiconductor memory chips simultaneously after the first two. In this case, if the four semiconductor memory chips MAS, SLA1, SAL2, and SLA3 are assigned chip identifiers (chip addresses), e.g., '00', '01', '10', and '11' as illustrated in FIG. 22A, then the chip selection signal CSEL corresponding to the master memory chip MAS and the second slave memory chip SLA2 may be '0' and the chip selection signal CSEL corresponding to the first slave memory chip SLA1 and the third slave memory chip SLA3 may be '1', as illustrated in FIG. 35.

Figure 36:
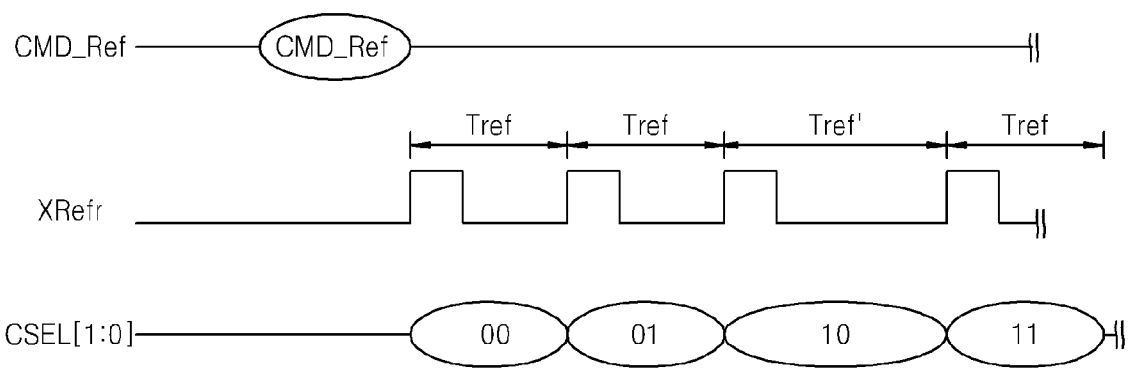

Referring to FIGS. 34 and 35, the refresh signal XRefr is illustrated as consisting of pulse signals having the same pulse duration Tref but is not limited thereto. For example, referring to FIG. 36, a particular semiconductor memory chip, e.g., a semiconductor memory chip corresponding to a chip selection signal CSEL that is '10', may be refreshed for a different time period than the other semiconductor memory chips. For example, a semiconductor memory chip, the performance of which is lowered more than the other semiconductor memory devices, may be refreshed for a longer period time than the other semiconductor memory devices.

Figure 37:
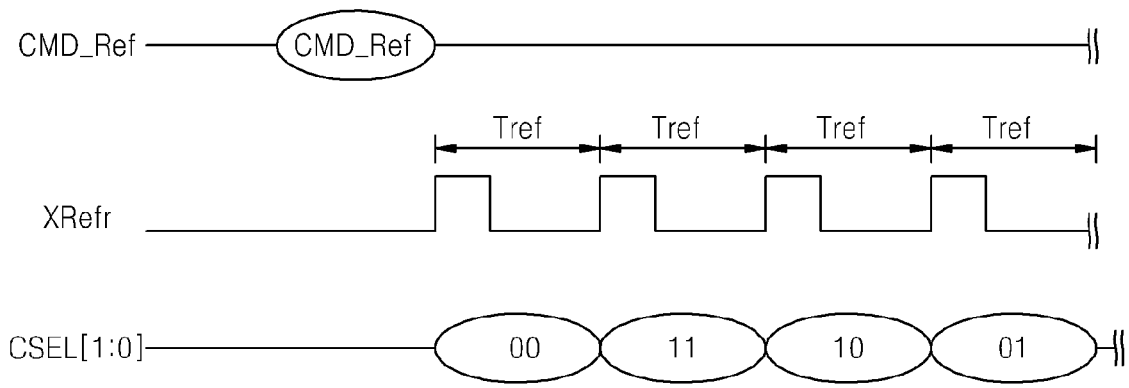

Referring to exemplary FIGS. 34 and 35, the semiconductor memory chips MAS, SLA1, SAL2, and SLA3 are refreshed individually or simultaneously in the order in which they are stacked, but are not limited thereto and may be refreshed in a random order regardless of this order, as illustrated, for example, in FIG. 37. Referring to FIG. 37, if the four semiconductor memory chips MAS, SLA1, SAL2, and SLA3 are assigned chip identifiers (chip addresses), e.g., '00', '01', '10', and '11' as illustrated for example in FIG. 22A, and chip selection signals CSEL have values of '00', '11', '10', and '01', respectively, the semiconductor memory chips MAS, SLA3, SAL2, and SLA1 are refreshed in that order.

Figure 38:
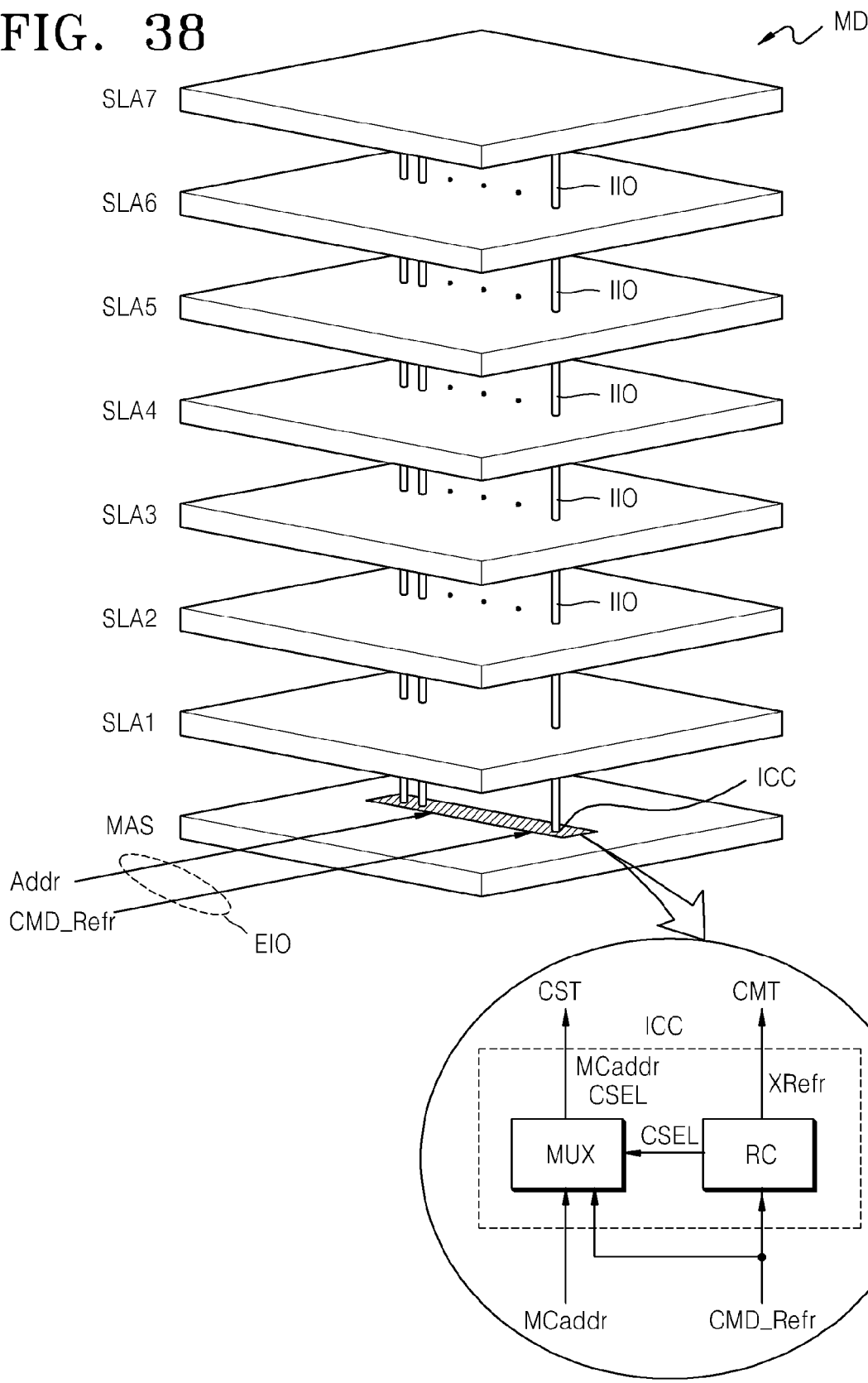
FIG. 38 illustrates a semiconductor memory device that includes the refresh controller of FIG. 31, according to another exemplary embodiment.
Figure 39:
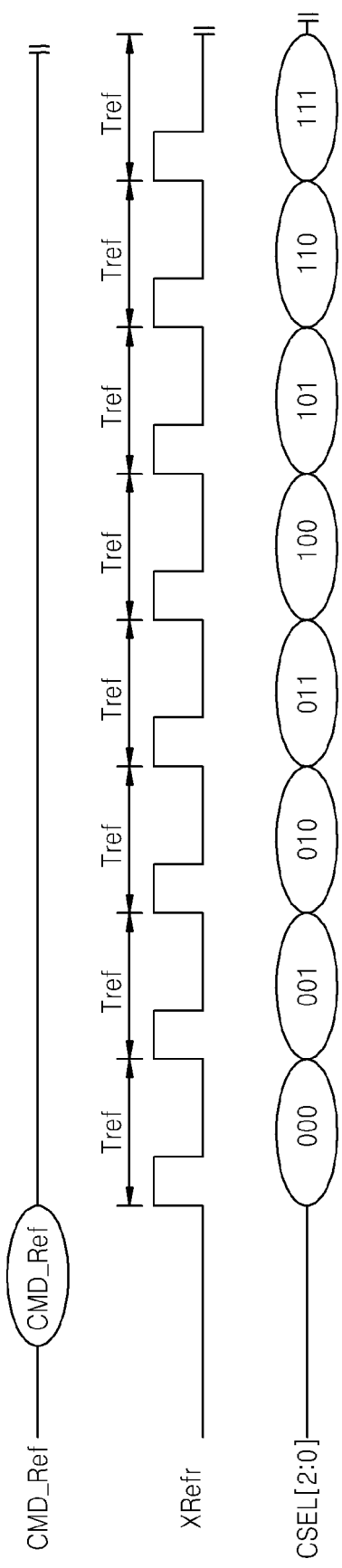
FIG. 39 is a timing diagram illustrating operations of the refresh controller of FIG. 38, according to another exemplary embodiment.

FIG. 38 illustrates a semiconductor memory device MD that includes the refresh controller of FIG. 31, according to another exemplary embodiment. In one embodiment, the semiconductor memory device MD of FIG. 38 is the same as the semiconductor memory device MD of FIG. 33 except for a number of slave memory chips. Referring to FIG. 38, the semiconductor memory device MD includes one master memory chip MAS and seven slave memory chips SLA1 to SLA7. In this embodiment, a structure and operation of an interface control circuit ICC that includes a refresh controller RC are the same as when the semiconductor memory device MD includes only the three slave memory chips SLA1 to SLA3, except for a number of pulse signals generated and a number of semiconductor memory chips to be refreshed according to one refresh command. For example, as illustrated in FIG. 39, when a refresh command CMD_Refr is input to the refresh controller RC, the refresh controller RC may output a refresh signal XRefr consisting of pulse signals that have the same pulse duration Tref and the number of which is equal to the number of the semiconductor memory chips. Also, chip selection signals CSEL corresponding to the eight semiconductor memory chips MAS and SLA1 to SLA7, respectively, are generated sequentially according to the refresh signal XRefr. In this case, chip identifiers (chip addresses) assigned to the eight semiconductor memory chips MAS and SLA1 to SLA7, respectively, may be as illustrated in shown in exemplary FIG. 22B.

As depicted in FIGS. 32-39, each chip may receive a refresh command and may undergo a refresh procedure in sequential order compared to other chips. For example, in the situation where chips are identified according to addressing bits (a chip ID example described in connection with 34 and 35), certain chips may receive the refresh commands and begin and complete a refresh procedure prior to other chips. The sequence of refreshing may be in the order in which the chips are addressed (i.e., 00, then 01, then 10, then 11), but may be in other orders instead. Also, certain chips may be refreshed simultaneously (by receiving a refresh command and performing refreshing at the same time). In addition, according to certain embodiments, although the chips may receive the refresh commands in sequence and perform refreshing separately, the refresh commands in at least some of the different chips may be received prior to a previous chip completing its refresh procedure. As such, multiple chips may undergo refreshing at the same time, even if they do not receive a refresh command or begin refreshing at the same time.

The sequence for refreshing semiconductor memory chips may include different patterns. For example, as explained above, the sequence may depend on a chip ID assigned to the different chips. In other cases, chips may be associated with a mode register set (MRS) controlling sequence, such that a register controls an order in which chips are refreshed. In another embodiment, refreshing can be determined based on memory banks within semiconductor memory chips.

A refresh controller of an interface control circuit included in a master memory chip in a semiconductor memory device having only one master memory chip according to one embodiment, has been described above, but the inventive concept is not limited thereto. A refresh controller according to one embodiment may also be included in an interface control circuit ICC included in an interface chip or a buffer chip. Also, as illustrated in FIG. 25, when each of a stacked structure of semiconductor memory chips includes a plurality of banks, the banks may be refreshed sequentially or in a random order.

Figure 40:
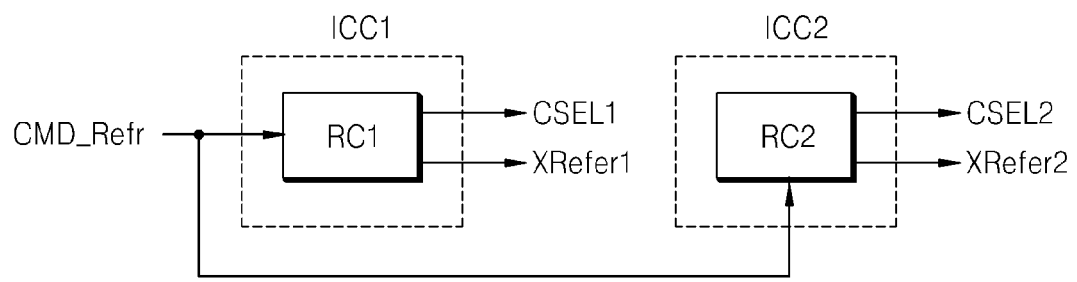
FIG. 40 is a block diagram of refresh controllers as shown in FIG. 31 included in a plurality of interface control circuits, respectively, according to certain exemplary embodiments.

In one embodiment, if a plurality of interface control circuits ICC1 and ICC2 are included as illustrated in FIG. 40, refresh controllers may be included in the interface control circuits ICC1 and ICC2, respectively. For example, the first interface control circuit ICC1 may include a first refresh controller RC1 and the second interface control circuit ICC2 may include a second refresh controller RC2. The first refresh controller RC1 may receive a refresh command CMD_Refr, and generate a refresh signal XRefr1 and a chip selection signal CSEL1 for semiconductor memory chips interfaced by the first interface control circuit ICC1. Similarly, the second refresh controller RC2 may receive the refresh command CMD_Refr, and generate a refresh signal XRefr2 and a chip selection signal CSEL2 for semiconductor memory chips interfaced by the second interface control circuit ICC2.

As described above, a refresh controller according to one embodiment may refresh a plurality of semiconductor memory chips sequentially or a random order, thereby preventing noise caused when all the plurality of semiconductor memory chips are refreshed simultaneously from being generated.

FIGS. 41A to 41C are block diagrams illustrating cases where an interface control circuit such as ICC of FIG. 1 includes at least two devices from among an I/O interface unit IU, an address scrambler AS, and a refresh controller RC, according to certain embodiments. Specifically, FIG. 41A illustrates a case where the interface control circuit ICC of FIG. 1 includes the I/O interface unit IU and the address scrambler AS. FIG. 41B illustrates a case where the interface control circuit ICC of FIG. 1 includes the I/O interface unit IU and the refresh controller RC. FIG. 41C illustrates a case where the interface control circuit ICC of FIG. 1 includes all of the I/O interface unit IU, the address scrambler AS, and the refresh controller RC. Other combinations or configurations may also be implemented without departing from the spirit and scope of the disclosed embodiments.

Figure 42:
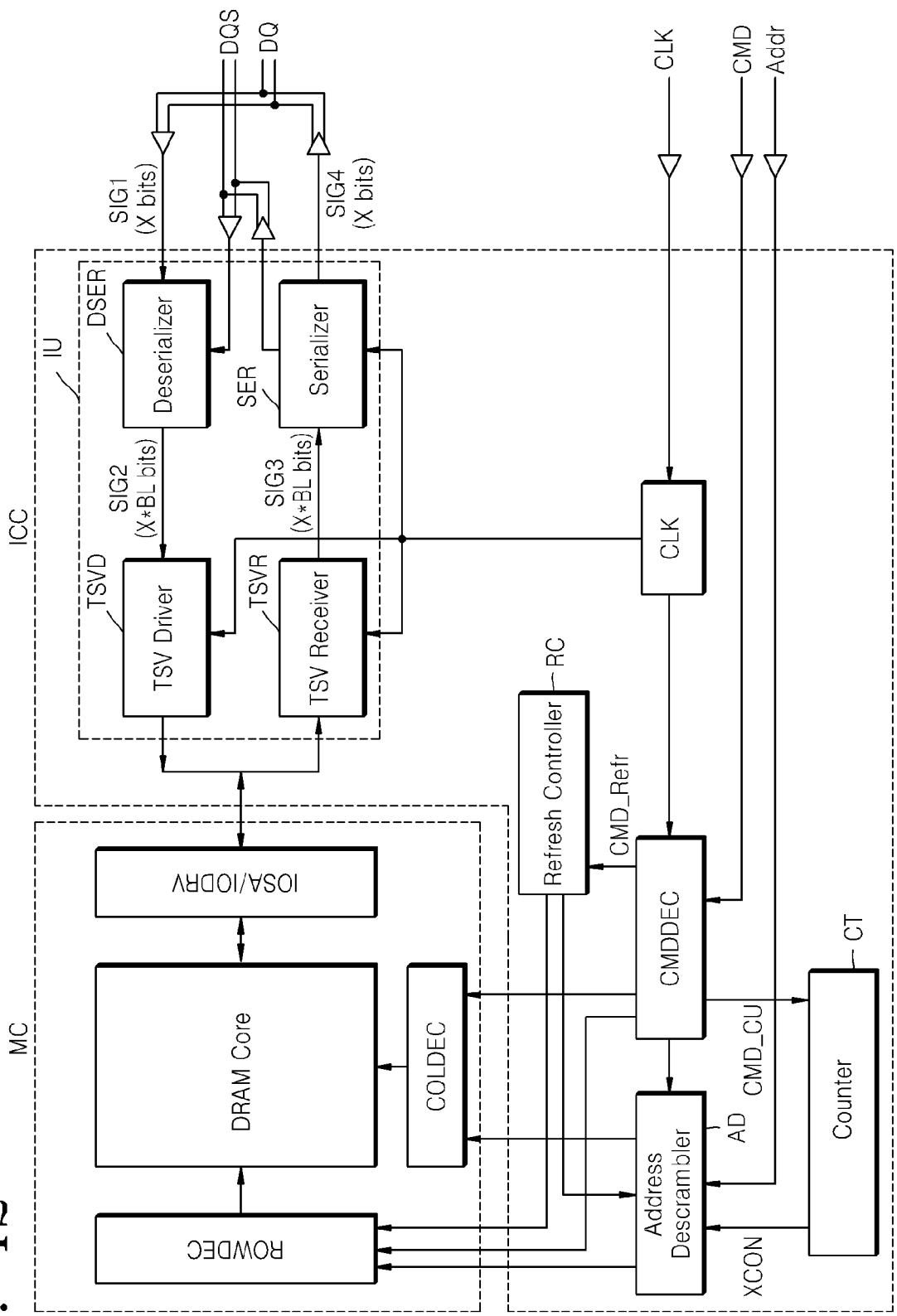
FIG. 42 is a block diagram more specifically illustrating the case of FIG. 41C, according to an exemplary embodiment.

FIG. 42 is a block diagram specifically illustrating the interface control circuit ICC of FIG. 41C, according to one exemplary embodiment. In FIG. 42, a semiconductor memory chip MC and a corresponding interface control circuit ICC are illustrated. The semiconductor memory chip MC includes a core corresponding to the storage region ARY of FIG. 1, e.g., a DRAM core, a row decoder ROWDEC and a column decoder COLDEC that decode an address Addr and activate a memory cell corresponding to the address Addr, a sensor IOSA that senses data read from the core, and an I/O driver IODRV via which data is received or output.

The interface control circuit ICC of FIG. 41C includes the I/O interface unit IU, the address scrambler AS, and the refresh controller RC. The I/O interface unit IU receives data SIG1 from an external device via a data I/O units DQ, and transmits data SIG4 to the external device via a data I/O unit DQS (both DQ and DQS may be differential signals). The interface control circuit ICC further includes a clock unit CLK that transmits a clock signal CLK to the other circuits of the interface control circuit ICC, and a command decoder CMDDEC that decodes a command CMD.

Figure 43:
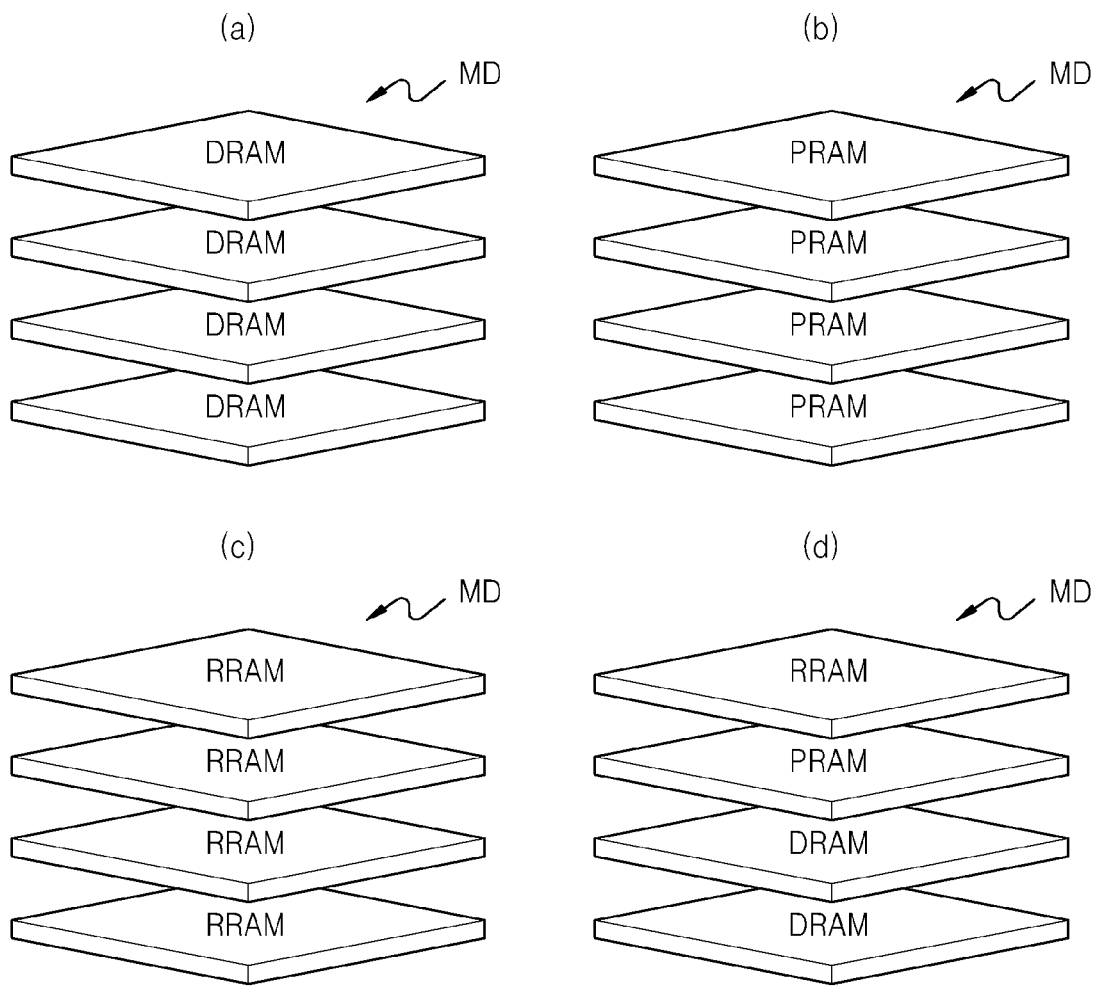
FIGS. 43A to 43D illustrate various examples of semiconductor memory chips as shown in FIG. 1 according to exemplary embodiments.

FIGS. 43A to 43D illustrate various examples of semiconductor memory chips MD as shown for example in FIG. 1 according to certain embodiments. A semiconductor memory device MD according to certain embodiments may include volatile or non-volatile memories as semiconductor memory chips. For example, a semiconductor memory device MD according to one embodiment may include semiconductor memory chips that are DRAMs (FIG. 43A), may include semiconductor memory chips that are Phase-change Random Access Memories (PRAMs) (FIG. 43B), or may include semiconductor memory chips that are Resistive Random Access Memories (RRAM) (FIG. 43C). Furthermore, a semiconductor memory device MD according to certain embodiments may include semiconductor memory chips that are different types of semiconductor memories (FIG. 43D).

Figure 44:
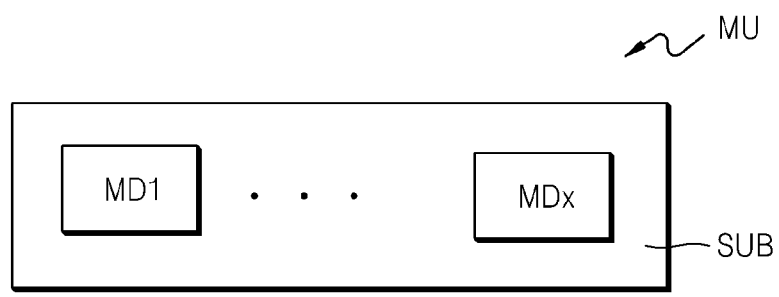
FIG. 44 is a schematic block diagram of a semiconductor memory module that includes a plurality of the semiconductor memory devices of FIG. 1, according to an exemplary embodiment.
Figure 45:
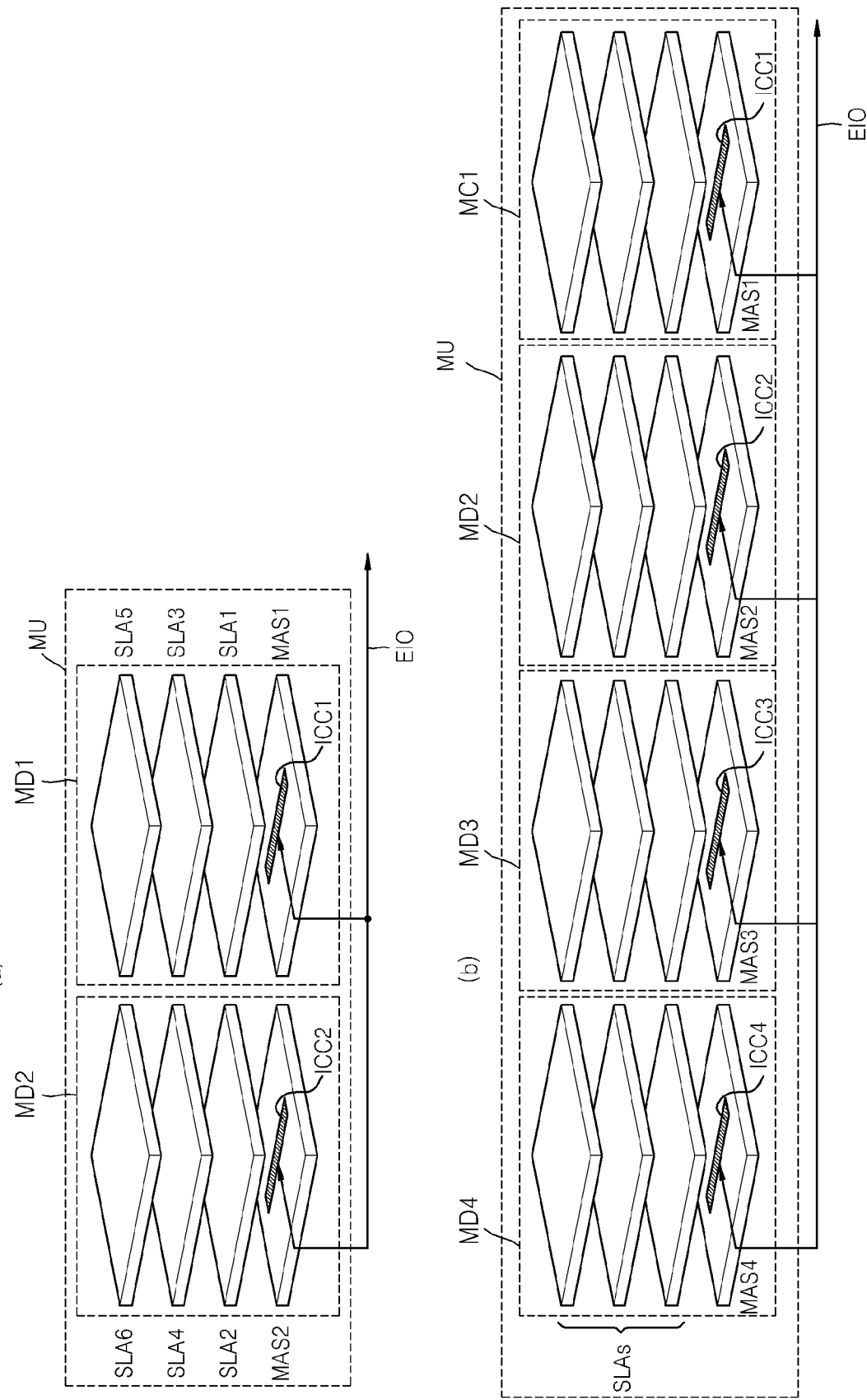

FIG. 44 is a schematic block diagram of a semiconductor memory module MU that includes a plurality of the semiconductor memory devices such as shown in FIG. 1, according to one embodiment. Referring to FIG. 44, the semiconductor memory module MU includes x semiconductor memory devices MD1, . . . , through to MDx (x denotes an integer equal to or greater than '2'). When each of the x semiconductor memory devices MD1, . . . , through to MDx included in the semiconductor memory module MU of FIG. 44 includes an interface control circuit according to one embodiment in a master memory chip thereof, the semiconductor memory module MU may have a structure as illustrated in exemplary FIG. 45A or 45B. In particular, if the semiconductor memory module MU includes two semiconductor memory devices, the semiconductor memory module MU may have a structure as illustrated in FIG. 45A. Referring to FIG. 45A, each of semiconductor memory devices MD1 and MD2 includes one master memory chip and three slave chips. Specifically, the first semiconductor memory device MD1 may include three slave memory chips SLA1 to SLA3, in which transmission or receiving of a signal is controlled via a first interface control circuit ICC1 included in a first master memory chip MAS1. Similarly, the second semiconductor memory device MD2 may include three slave memory chips SLA4 to SLAG, in which transmission or receiving of a signal is controlled via a second interface control circuit ICC2 included in the second master memory chip MAS2.

If the semiconductor memory module MU of FIG. 44 includes four semiconductor memory devices MD1 to MD4, then the semiconductor memory module MU may have a structure as illustrated in FIG. 45B. Specifically, the four semiconductor memory devices MD1 to MD4 may include master memory chips MAS1 to MAS4 having corresponding interface control circuits ICC1 to ICC4, respectively.

However, the inventive concept is not limited to the embodiments of FIGS. 45A and 45B, and those of ordinary skill in the art may derive semiconductor memory modules according to the other various embodiments, in which each of semiconductor memory devices includes two or more master memory chips and less than or more than four slave memory chips unlike in FIGS. 45A and 45B, from the description of the semiconductor memory devices according to the above embodiments.

Figure 46:
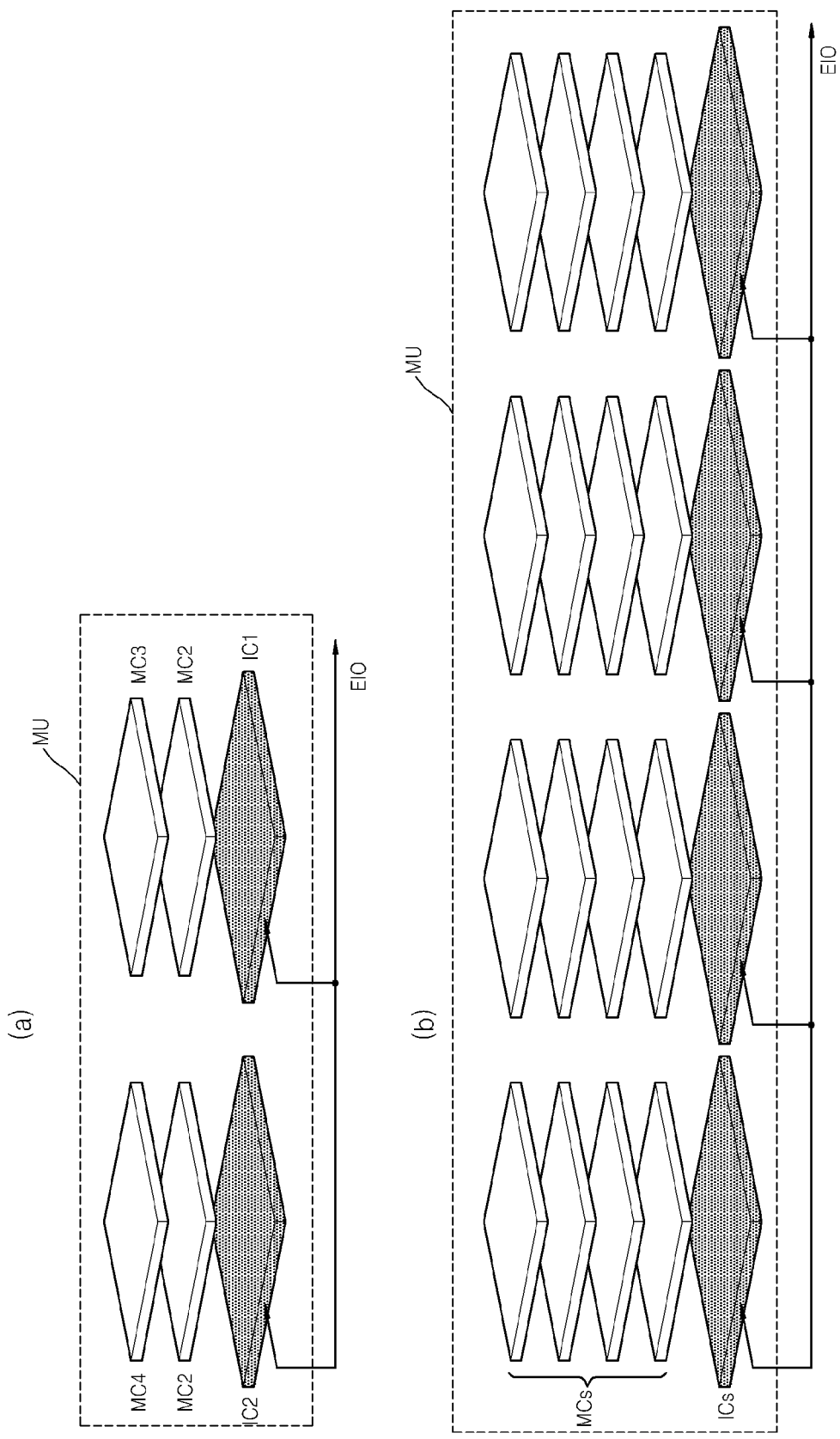

In one embodiment, if each of semiconductor memory devices, such as those included in the semiconductor memory module MU of FIG. 44, includes an interface control circuit in an interface chip located separately from the corresponding semiconductor memory chip, then the semiconductor memory module MU may have a structure as illustrated in FIG. 46A or 46B. In particular, the semiconductor memory module MU may have a structure as illustrated in FIG. 46A when two semiconductor memory devices are included therein, and may have a structure as illustrated in FIG. 46B when four semiconductor memory devices are included therein. Those of ordinary skill in the art can derive the semiconductor memory modules MU illustrated in FIGS. 46A and 46B from the above description of the semiconductor memory module MU depicted in FIG. 45. Accordingly, the semiconductor memory modules MU illustrated in FIGS. 46A and 46B will be not described here.

FIGS. 47 to 52 illustrate various examples of a semiconductor memory system according to certain embodiments. Referring to FIGS. 47 to 52, each of semiconductor memory systems MS may include a plurality of semiconductor memory modules MU1 to MUk on a board BD, and a memory controller MCT. In one embodiment, each of the semiconductor memory modules MU1 to MUk may be identical to the semiconductor memory module MU of FIG. 44, and the memory controller MCT may be identical to the memory controller MCT of FIG. 1.

Figure 47:
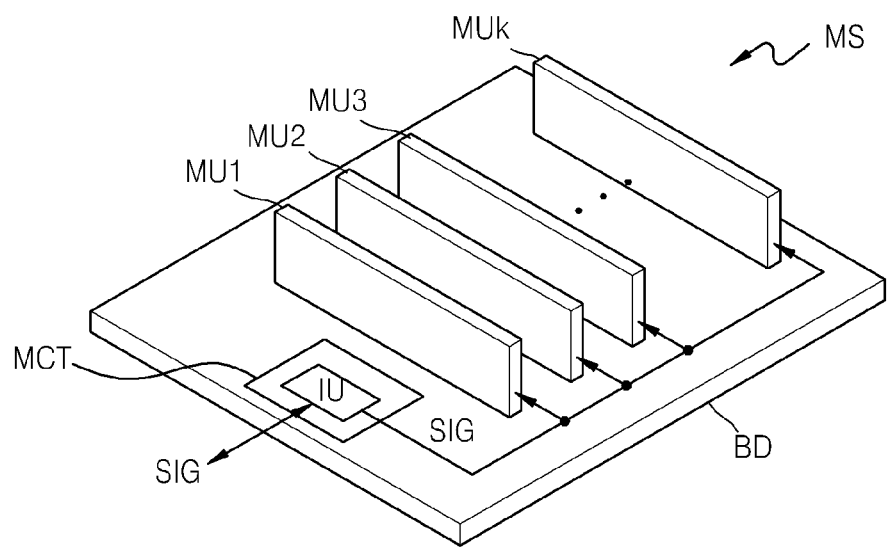
FIGS. 47 to 52 illustrate various examples of a semiconductor memory system according to exemplary embodiments.
Figure 48:
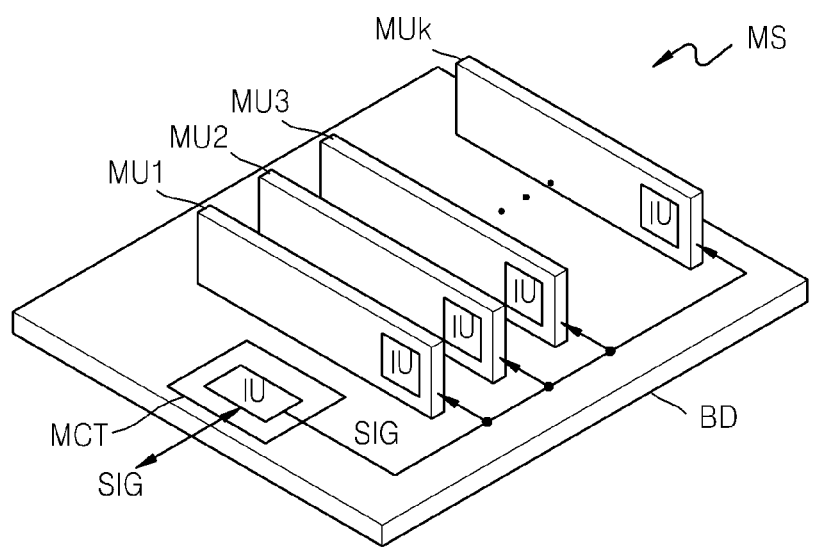

Each of the memory controllers MCT of FIGS. 47 and 48 may include an I/O interface unit IU that performs an interface between the semiconductor memory modules MU1 to MUk and an external circuit, e.g., a processor. In particular, in the semiconductor memory system MS of FIG. 48, each of the semiconductor memory modules MU1 to MUk may also include an I/O interface unit IU that performs as an interface between semiconductor memory devices, such as shown in FIG. 44, and the memory controller MCT.

Figure 49:
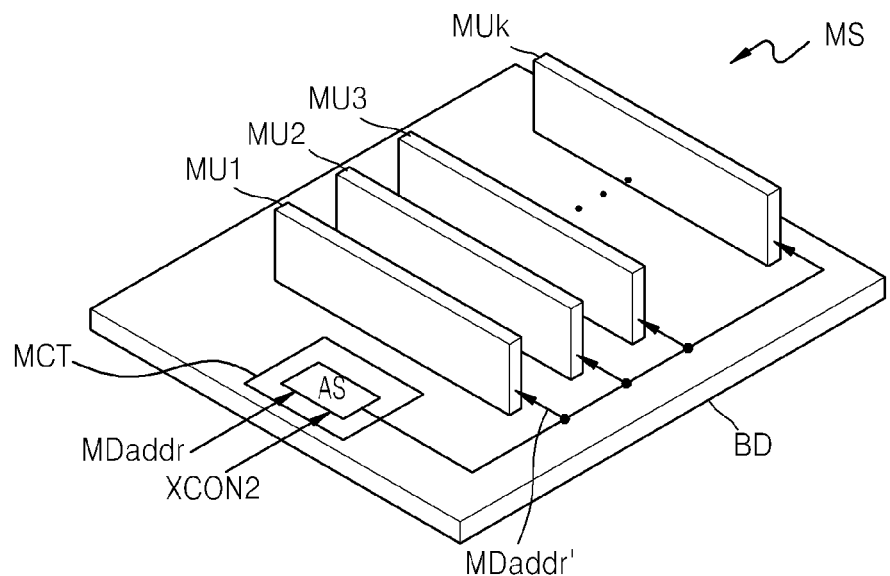
Figure 50:
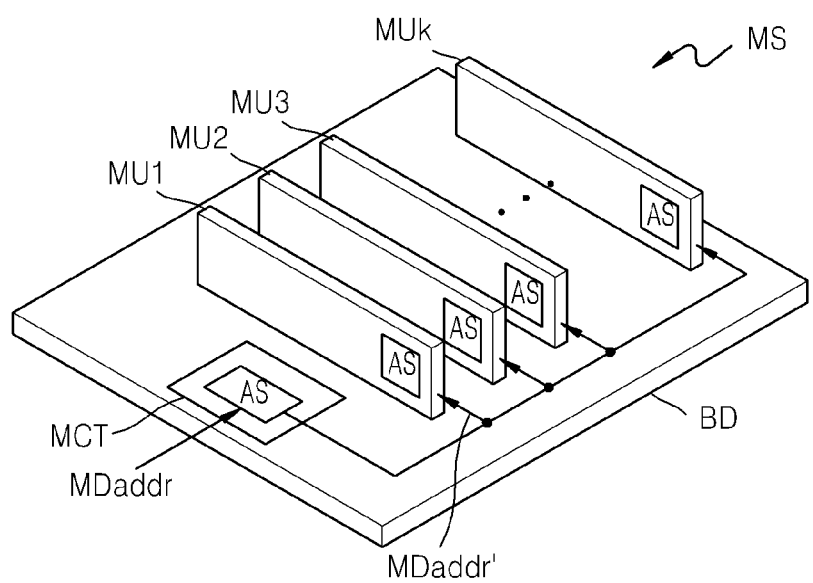

Each of the memory controllers MCT of FIGS. 49 and 50 may include an address scrambler AS that scrambles a module address MDaddr for identifying a semiconductor memory device (conversion from the module address MDaddr to another module address MDaddr') so as to prevent a semiconductor memory module from being accessed excessively from among the semiconductor memory modules MU1 to MUk, in response to a second control signal XCON2. In particular, in the semiconductor memory system MS of FIG. 50, each of the semiconductor memory modules MU1 to MUk also includes an address scrambler AS that scrambles addresses of semiconductor memory devices, such as shown in FIG. 44, so as to prevent a semiconductor memory device from being accessed excessively from among the semiconductor memory devices.

Figure 51:
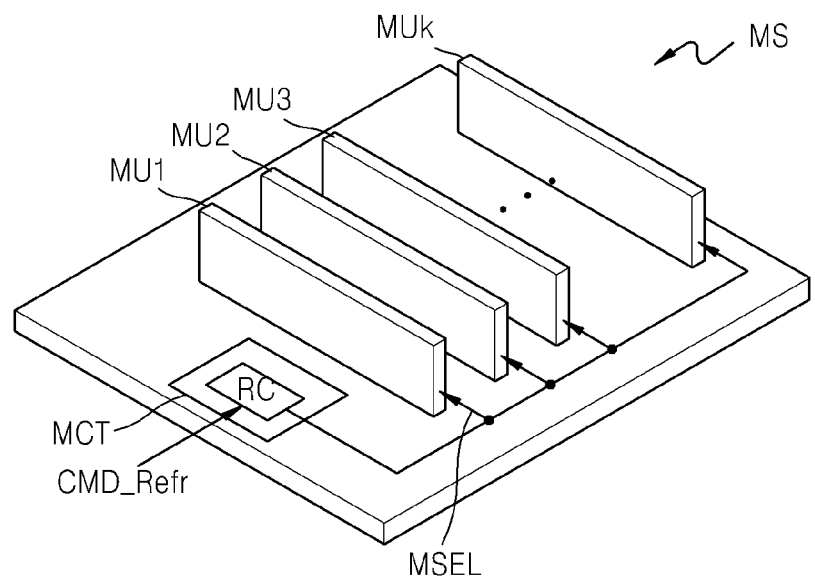
Figure 52:
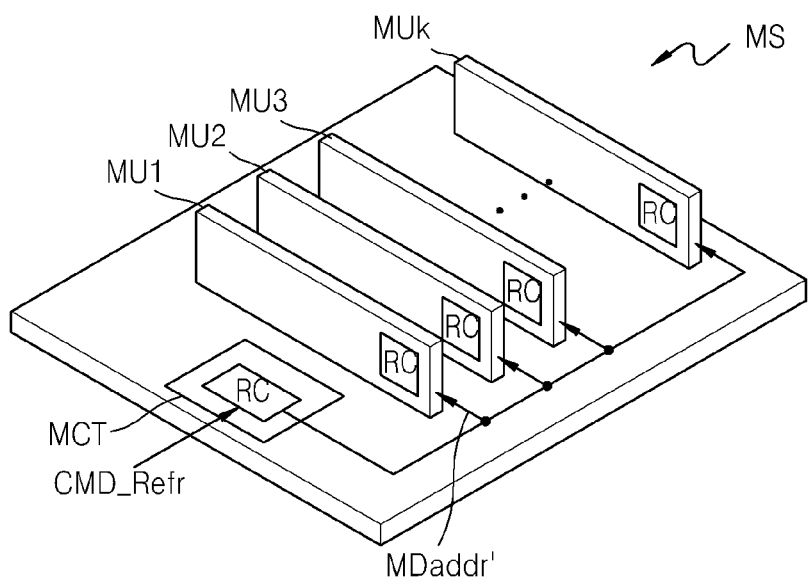

Each of the memory controllers MCT of FIGS. 51 and 52 may include a refresh controller RC that refreshes semiconductor memory devices, such as shown in FIG. 44, sequentially or in a random order by generating a module selection signal MSEL for identifying the semiconductor memory modules MU1 to MUk.

Operations of the I/O interface unit IU, the address scrambler AS, and the refresh controller RC illustrated in each of FIGS. 47 to 52 may be similar to those of the I/O interface unit IU of FIG. 3, the address scrambler AS of FIG. 15, and the refresh controller RC of FIG. 31, respectively. Furthermore, although not shown, a memory controller of a semiconductor memory system according to one embodiment may include an interface control circuit ICC that includes all an I/O interface unit IU, an address scrambler AS, and a refresh controller RC, as shown in exemplary FIG. 42.

While the present disclosure has been particularly shown and described with reference to exemplary embodiments thereof, it will be understood that various changes in form and details may be made therein without departing from the spirit and scope of the following claims.

What is claimed is:

1. A semiconductor package comprising:
    a package interface including at least a first pair of terminals,
    a stack of semiconductor chips;
    a plurality of stacks of through substrate vias, each stack of through substrate vias comprising plural through substrate vias of respective ones of the semiconductor chips, each through substrate via electrically connected to a through substrate via of an immediately adjacent semiconductor chip;
    an interface circuit including an input connected to the first pair of terminals to receive a differential signal providing first information, and including an output to provide an output signal including the first information in a single-ended signal format to at least one of the plurality of stacks of through substrate vias; and
    one or more single terminals included in the package interface, the one or more single terminals connected to an input to receive one or more respective single-ended input signals, wherein the differential signal is a data signal, and the one or more respective single-ended input signals are not data signals.

2. The semiconductor package of claim 1, wherein the interface circuit includes an input buffer including the input and the output.

3. The semiconductor package of claim 1, wherein the interface circuit is configured to provide the output signal as a single-ended signal to at least two of the plurality of stacks of through substrate vias.

4. The semiconductor package of claim 1, wherein the interface circuit is configured to provide the output signal as a single-ended signal to only one stack of through substrate vias.

5. The semiconductor package of claim 1, wherein the interface circuit is configured to interpret the differential signal as a multi-level signal, and to output the single-ended signal based on the interpreted multi-level signal.

6. The semiconductor package of claim 1, wherein the interface circuit is configured to receive data at a first frequency from the first pair of terminals and to output data at a second frequency, lower than the first frequency.

7. The semiconductor package of claim 6, wherein the interface circuit includes a deserializer to receive first data as multiple sequential packets from the pair of terminals and to output the first data in parallel to at least two of the plurality of stacks of through substrate vias.

8. The semiconductor package of claim 7, wherein the first frequency is a multiple of $2^n$ of the second frequency, wherein n is an integer.

9. The semiconductor package of claim 1, wherein the interface circuit is part of one of the semiconductor chips forming the stack of semiconductor chips.

10. The semiconductor package of claim 9, wherein the package comprises only two semiconductor chips.

11. The semiconductor package of claim 1, further comprising:
    a package substrate on which the stack of semiconductor chips is disposed,
    wherein the interface circuit is part of the package substrate.

12. The semiconductor package of claim 1, wherein at least one stack of the plurality of stacks of through substrate vias extends through the entire stack of semiconductor chips.

13. The semiconductor package of claim 1, further comprising:
    a non-conductive encapsulant covering a top and side portions of the stack of semiconductor chips.

14. A semiconductor package comprising:
    a package interface including at least a first pair of terminals,
    a stack of semiconductor chips;
    a plurality of stacks of through substrate vias, each stack of through substrate vias comprising plural through substrate vias of respective ones of the semiconductor chips, each through substrate via electrically connected to a through substrate via of an immediately adjacent semiconductor chip; and
    an interface circuit including an input connected to the first pair of terminals to receive a differential input signal providing first information, and including an output to provide an output signal including the first information to at least one of the plurality of stacks of through substrate vias,
    wherein the interface circuit is configured to receive data at a first frequency from the first pair of terminals and to output data at a second frequency, lower than the first frequency.

15. The semiconductor package of claim 14, wherein the interface circuit includes an input buffer including the input and the output.

16. The semiconductor package of claim 14, wherein the interface circuit is configured to provide a differential output signal as the output signal to at least two of the plurality of stacks of through substrate vias.

17. The semiconductor package of claim 14, wherein the interface circuit is configured to provide a differential output signal as the output signal to only one stack of through substrate vias.

18. The semiconductor package of claim 14, wherein the interface circuit is configured to interpret the differential input signal as a multi-level signal, and to output the output signal based on the interpreted multi-level signal.

19. The semiconductor package of claim 14, wherein the interface circuit includes a deserializer to receive first data as multiple sequential packets from the pair of terminals and to output the first data in parallel to at least two of the plurality of stacks of through substrate vias.

20. The semiconductor package of claim 14, wherein the first frequency is a multiple of $2^n$ of the second frequency, wherein n is an integer.

21. The semiconductor package of claim 14, wherein the interface circuit is part of one of the semiconductor chips forming the stack of semiconductor chips.

22. The semiconductor package of claim 21, wherein the package comprises only two semiconductor chips.

23. The semiconductor package of claim 14, further comprising:
    a package substrate on which the stack of semiconductor chips is disposed,
    wherein the interface circuit is part of the package substrate.

24. The semiconductor package of claim 14, wherein at least one stack of the plurality of stacks of through substrate vias extends through the entire stack of semiconductor chips.

25. A semiconductor package comprising:
- a package interface including at least a first pair of terminals,
- a stack of semiconductor chips;
- a plurality of stacks of through substrate vias, each stack of through substrate vias comprising plural through substrate vias of respective ones of the semiconductor chips, each through substrate via electrically connected to a through substrate via of an immediately adjacent semiconductor chip;
- an interface circuit including an input connected to the first pair of terminals to receive a differential input signal providing first information, and including an output to provide an output signal including the first information to at least one of the plurality of stacks of through substrate vias; and
- one or more single terminals included in the package interface, the one or more single terminals connected to an input to receive one or more respective single-ended input signals,
- wherein the differential input signal is a data signal, and the one or more respective single-ended input signals are not data signals.

26. The semiconductor package of claim 14, further comprising:
- a non-conductive encapsulant covering a top and side portions of the stack of semiconductor chips.

27. A semiconductor package comprising:
- a package interface including at least a first pair of terminals,
- a stack of semiconductor chips;
- a plurality of stacks of through substrate vias, each stack of through substrate vias comprising plural through substrate vias of respective ones of the semiconductor chips, each through substrate via electrically connected to a through substrate via of an immediately adjacent semiconductor chip; and
- an interface circuit including an input connected to the first pair of terminals to receive a differential input signal providing first information, and including an output to provide an output signal including the first information to at least one of the plurality of stacks of through substrate vias,
- wherein the interface circuit is configured to interpret the differential input signal as a multi-level signal, and to provide the output signal based on the interpreted multi-level signal.

28. The semiconductor package of claim 27, wherein the interface circuit includes an input buffer including the input and the output.

29. The semiconductor package of claim 27, wherein the interface circuit is configured to provide the output signal as a single-ended signal to at least two of the plurality of stacks of through substrate vias.

30. The semiconductor package of claim 27, wherein the interface circuit is configured to provide the output signal as a single-ended signal to only one stack of through substrate vias.

31. The semiconductor package of claim 27, wherein the interface circuit is configured to provide the output signal as a differential signal to at least two of the plurality of stacks of through substrate vias.

32. The semiconductor package of claim 27, wherein the interface circuit is configured to receive data at a first frequency from the first pair of terminals and to output data at a second frequency, lower than the first frequency.

33. The semiconductor package of claim 32, wherein the interface circuit includes a deserializer to receive first data as multiple sequential packets from the pair of terminals and to output the first data in parallel to at least two of the plurality of stacks of through substrate vias.

34. The semiconductor package of claim 33, wherein the first frequency is a multiple of $2^n$ of the second frequency, wherein n is an integer.

35. The semiconductor package of claim 27, wherein the interface circuit is part of one of the semiconductor chips forming the stack of semiconductor chips.

36. The semiconductor package of claim 35, wherein the package comprises only two semiconductor chips.

37. The semiconductor package of claim 27, further comprising:
- a package substrate on which the stack of semiconductor chips is disposed,
- wherein the interface circuit is part of the package substrate.

38. The semiconductor package of claim 27, wherein at least one stack of the plurality of stacks of through substrate vias extends through the entire stack of semiconductor chips.

39. The semiconductor package of claim 27, further comprising:
- one or more single terminals included in the package interface, the one or more single terminals connected to an input to receive one or more respective single-ended input signals, wherein the differential input signal is a data signal, and the one or more respective single-ended input signals are not data signals.

40. The semiconductor package of claim 27, further comprising:
- a non-conductive encapsulant covering a top and side portions of the stack of semiconductor chips.

41. A semiconductor package comprising:
- package terminals connectable to an address bus;
- a stack of memory chips;
- an interface circuit, comprising:
  - an address buffer connected to the package terminals to receive an external address,
  - an address translation circuit connected to receive the external address from the address buffer, and having an output of an internal address, and
  - a monitoring circuit configured to monitor an amount of access operations to at least one memory location of the stack of memory chips and provide a corresponding monitoring result; and
- a plurality of stacks of through substrate vias, each stack of through substrate vias comprising plural through substrate vias of respective ones of the memory chips of the stack, each through substrate via electrically connected to a through substrate via of a immediately adjacent memory chip, each stack of through substrate vias connected to receive the internal address at the output of the address translation circuit;
- wherein the address translation circuit is configured to translate the external address to an internal address in response to at least the monitoring result of the monitoring circuit.

42. The semiconductor package of claim 41, wherein the stack of memory chips comprises a stack of volatile memory chips, and wherein the monitoring circuit monitors a frequency of writing to memory locations of the volatile memory chips of the stack of memory chips.

43. The semiconductor package of claim 42, wherein the volatile memory chips comprise DRAM chips.

44. The semiconductor package of claim 41, wherein the monitoring circuit monitors a frequency of access of memory locations of the memory chips of the stack of memory chips.

45. The semiconductor package of claim 41, wherein the monitoring circuit counts a number of sequential writes to the at least one memory location.

46. A semiconductor package comprising:
package terminals;
a stack of memory chips;
an interface circuit, comprising:
   an address buffer connected to the package terminals to receive an external address, and
   an address translation circuit connected to receive the external address from the address buffer, and having an output that outputs an internal address;
a plurality of stacks of through substrate vias, each stack of through substrate vias comprising plural through substrate vias of respective ones of the memory chips each electrically connected to a through substrate via of an immediately adjacent memory chip, each stack of the plurality of stacks of through substrate vias connected to receive an internal address at the output of the address translation circuit; and
the interface circuit comprising a refresh controller in logical communication with the package terminals and configured to receive an external refresh control signal, the refresh controller operable to output a series of internal refresh control signals, each of the series of internal refresh control signals operable to initiate a memory refresh of different parts of the stack of memory chips.

47. The semiconductor package of claim 46, wherein each different part of the stack of memory chips comprises a single memory chip.

48. The semiconductor package of claim 46, wherein each different part of the stack of memory chips comprises plural memory chips.

49. The semiconductor package of claim 46, wherein each internal refresh control signal is a refresh code.

50. The semiconductor package of claim 46, wherein each internal refresh control signal is a refresh code and chip address.

51. The semiconductor package of claim 46, wherein the stack of memory chips comprises one of: a stack of PRAM chips, a stack of DRAM chips, and an stack of RRAM chips.

52. The semiconductor package of claim 46, wherein the stack of memory chips comprises only DRAM chips directly stacked on one another.

53. A semiconductor package comprising:
a package interface including package terminals including at least a first pair of terminals,
a stack of memory chips;
a plurality of stacks of through substrate vias, each stack of through substrate vias comprising plural through substrate vias of respective ones of the memory chips, each through substrate via electrically connected to a through substrate via of an immediately adjacent memory chip; and
an interface circuit including:
   an input connected to the first pair of terminals to receive a differential signal providing first information, and including an output to provide an output signal including the first information in a single-ended signal format to at least one of the plurality of stacks of through substrate vias
   an address buffer connected to a plurality of the package terminals to receive an external address,
   an address translation circuit connected to receive the external address from the address buffer, and having an output of an internal address,
   a monitoring circuit configured to monitor an amount of access operations to at least one memory location of the stack of memory chips and provide a corresponding monitoring result, and
   a refresh controller in logical communication with a plurality of the package terminals and configured to receive an external refresh control signal, the refresh controller operable to output a series of internal refresh control signals, each of the series of internal refresh control signals operable to initiate a memory refresh of different parts of the stack of memory chips,
   wherein the address translation circuit is configured to translate the external address to an internal address in response to at least the monitoring result of the monitoring circuit.

54. The semiconductor package of claim 53, wherein the interface circuit is configured to provide the output signal as a single-ended signal to at least two of the plurality of stacks of through substrate vias.

55. The semiconductor package of claim 53, wherein the interface circuit is configured to provide the output signal as a single-ended signal to only one stack of through substrate vias.

56. The semiconductor package of claim 53, wherein the interface circuit is configured to interpret the differential signal as a multi-level signal, and to output the single-ended signal based on the interpreted multi-level signal.

57. The semiconductor package of claim 53, wherein the stack of memory chips comprises a stack of volatile memory chips, and wherein the monitoring circuit monitors a frequency of writing to memory locations of the volatile memory chips of the stack of memory chips.

58. The semiconductor package of claim 53, wherein the monitoring circuit monitors a frequency of access of memory locations of the memory chips of the stack of memory chips.

59. The semiconductor package of claim 53, wherein each different part of the stack of memory chips comprises a single memory chip.

60. The semiconductor package of claim 53, wherein each different part of the stack of memory chips comprises plural memory chips.

* * * * *